United States Patent
Zewail et al.

(10) Patent No.: US 8,841,613 B2
(45) Date of Patent: Sep. 23, 2014

(54) METHOD AND SYSTEM FOR 4D TOMOGRAPHY AND ULTRAFAST SCANNING ELECTRON MICROSCOPY

(75) Inventors: Ahmed H. Zewail, Pasadena, CA (US);
Oh-Hoon Kwon, Burbank, CA (US);
Omar Farghaly Mohammed Abdelsaboor, Pasadena, CA (US);
Ding-Shyue Yang, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1011 days.

(21) Appl. No.: 12/884,001

(22) Filed: Sep. 16, 2010

(65) Prior Publication Data
US 2011/0284744 A1 Nov. 24, 2011

Related U.S. Application Data

(60) Provisional application No. 61/367,269, filed on Jul. 23, 2010, provisional application No. 61/346,861, filed on May 20, 2010.

(51) Int. Cl.
*H01J 37/28* (2006.01)
*H01J 37/285* (2006.01)
*H01J 37/22* (2006.01)

(52) U.S. Cl.
CPC ......... *H01J 37/28* (2013.01); *H01J 2237/0432* (2013.01); *H01J 37/285* (2013.01); *H01J 2237/20207* (2013.01); *H01J 2237/2065* (2013.01); *H01J 2237/2611* (2013.01); *H01J 2237/2004* (2013.01); *H01J 2237/2803* (2013.01); *H01J 37/228* (2013.01)
USPC ........................ 250/307; 250/310; 250/311

(58) Field of Classification Search
CPC ........................................................ H01J 37/28
USPC .................... 250/363.04, 307, 310, 311
See application file for complete search history.

(56) References Cited

U.S. PATENT DOCUMENTS

5,289,519 A 2/1994 Rand
2005/0253069 A1 11/2005 Zewail et al.

FOREIGN PATENT DOCUMENTS

EP 1953791 A1 6/2008
WO WO 95/17081 A1 6/1995

OTHER PUBLICATIONS

Barwick et al ("4D Imaging of Transient Structures and Morphologies in Ultrafast Electron Microscopy"), Nov. 21, 2008, Science Magazine vol. 322 No. 5905, pp. 1227-1231.*

(Continued)

*Primary Examiner* — David Porta
*Assistant Examiner* — Faye Boosalis
(74) *Attorney, Agent, or Firm* — Kilpatrick Townsend & Stockton LLP

(57) ABSTRACT

A 4D electron tomography system includes a stage having one or more degrees of freedom, an electron source, and electron optics operable to direct electron pulses to impinge on a sample supported on the stage. A pulse of the electron pulses impinges on the sample at a first time. The system also includes a laser system and optics operable to direct optical pulses to impinge on the sample. A pulse of the optical pulses impinges on the sample at a second time. The system further includes a detector operable to receive the electron pulses passing through the sample, a controller operable to independently modify an orientation of the stage and at least one of the first time or the second time, a memory operable to store sets of images, and a processor operable to form a 4D tomographic image set from the sets of images.

29 Claims, 16 Drawing Sheets

(56) References Cited

OTHER PUBLICATIONS

Notification of Transmittal of the International Search Report and the Written Opinion of the International Searching Authority, or the Declaration; International Search Report and Written Opinion of the International Searching Authority for corresponding International Application No. PCT.US2010/049185 mailed on Jun. 16, 2011, 9 pages.

* cited by examiner

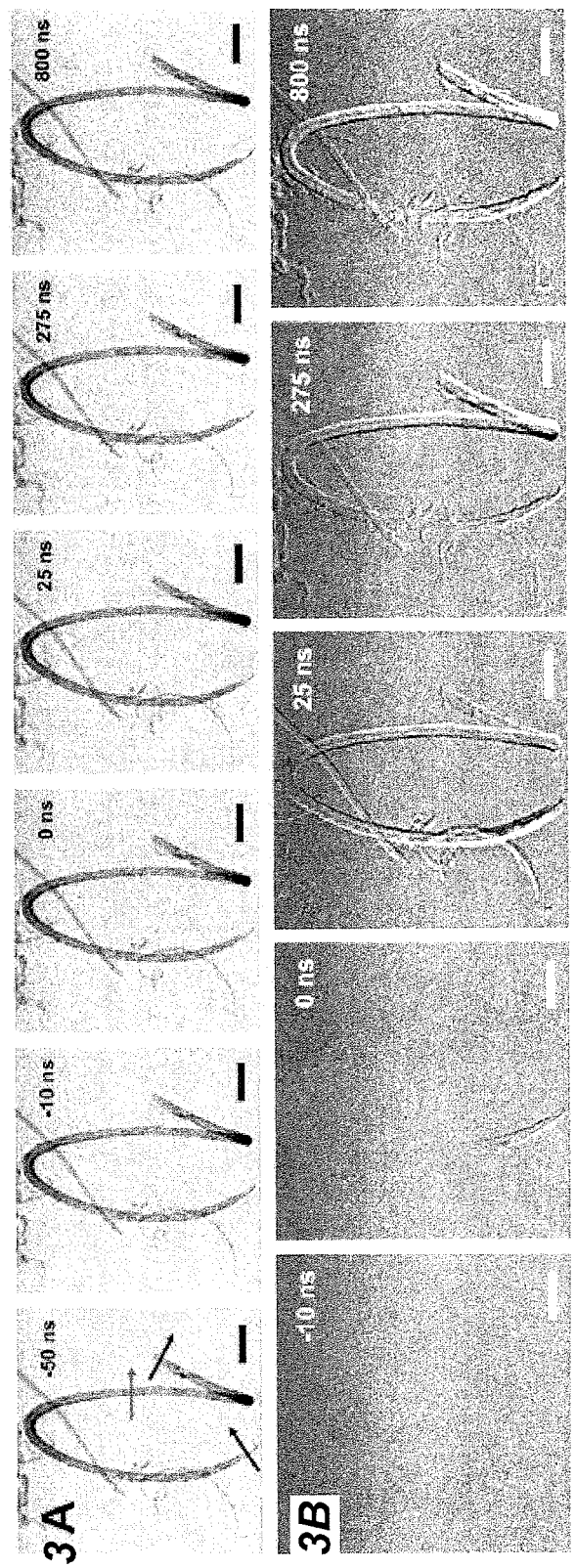

METHOD AND SYSTEM FOR 4D TOMOGRAPHY AND ULTRAFAST SCANNING ELECTRON MICROSCOPY

CROSS-REFERENCES TO RELATED APPLICATIONS

This application claims the benefit of U.S. Provisional Patent Application No. 61/346,861, filed May 20, 2010, entitled "4D Electron Tomography," and U.S. Provisional Patent Application No. 61/367,269, filed Jul. 23, 2010, entitled "Scanning Ultrafast Electron Microscopy," which are commonly assigned, the disclosures of which are hereby incorporated by reference in their entirety.

STATEMENT AS TO RIGHTS TO INVENTIONS MADE UNDER FEDERALLY SPONSORED RESEARCH OR DEVELOPMENT

The U.S. Government has certain rights in this invention pursuant to Grant No. FA9550-07-1-0484 awarded by the Air Force (AFOSR) and Grant Nos. CHE0549936 & DMR0504854 awarded by the National Science Foundation.

BACKGROUND OF THE INVENTION

For nearly a century, researchers have developed techniques to image specimens. These imaging techniques include electron microscopy. Imaging of crystalline and biological assemblies has been performed using X-ray and electron-based methods. Despite the progress made in imaging systems, there is a need in the art for improved methods and systems for imaging specimens.

SUMMARY OF THE INVENTION

According to embodiments of the present invention, methods and systems related to microscopy are provided. In a particular embodiment, methods and systems are provided in relation to 4D ultrafast electron tomography of samples with nanometer and femtosecond resolution. In another embodiment, methods and systems are provided in relation to scanning ultrafast electron microscopy. The techniques described herein are applicable to a variety of ultrafast imaging applications.

According to an embodiment of the present invention, a 4D electron tomography system is provided. The 4D electron tomography system includes a stage having one or more degrees of freedom, an electron source operable to provide electron pulses, and electron optics operable to direct the electron pulses to impinge on a sample supported on the stage. A pulse of the electron pulses impinges on the sample at a first time. The 4D electron tomography system also includes a laser system operable to provide optical pulses and optics operable to direct the optical pulses to impinge on the sample. A pulse of the optical pulses impinges on the sample at a second time. The 4D electron tomography system further includes a detector operable to receive the electron pulses passing through the sample, a controller operable to independently modify an orientation of the stage and at least one of the first time or the second time, a memory operable to store sets of images associated with a predetermined delay time between the first time and the second time, and a processor operable to form a 4D tomographic image set from the sets of images.

According to another embodiment of the present invention, a method for performing 4D tomography of a sample is provided. The method includes a) positioning a sample on a stage having one or more degrees of freedom. The stage is characterized by a tilt angle. The method also includes b) exposing the sample to a series of optical pulses, c) exposing the sample to a series of electron pulses, d) transmitting at least a portion of the series of electron pulses through the sample, and e) detecting the at least a portion of the series of electron pulses using a two-dimensional detector. The method further includes f) storing an image of the sample in a memory, g) tilting the stage to a new tilt angle, and h) repeating steps b) through g) for a series of tilt angles. Additionally, the method includes i) forming a three-dimensional image using the images stored in memory, j) adjusting a time delay between pulses of the series of optical pulses and pulses of the series of electron pulses, and k) repeating steps b) through j) for a series of time delays.

According to a specific embodiment of the present invention, a scanning ultrafast electron microscope system is provided. The system includes a specimen chamber, a cathode disposed in the specimen chamber, and a specimen stage disposed in the specimen chamber. The system also includes a laser system operable to provide a beam of femtosecond pulses, a beam splitter coupled to the laser system and operable to provide a first optical beam and a second optical beam, and an optical delay stage operable to receive the first optical beam. The system further includes a first optical system operable to direct the first optical beam into the specimen chamber to impinge on the specimen and a second optical system operable to direct the second optical beam into the electron column to impinge on the cathode in a field-emission-source configuration. The cathode is operable to generate electron pulses in response to the second optical beam. Additionally, the system includes electron optics disposed in the electron column and operable to direct the electron pulses to impinge on a specimen supported on the specimen stage and to scan the electron pulses with respect to the specimen, a detector operable to detect at least one of secondary electrons or backscattered electrons, and a controller coupled to the detector and the optical delay stage.

According to another specific embodiment of the present invention, a method of obtaining an image of a sample is provided. The method includes providing a first series of laser pulses having a first duration and a first wavelength, directing the first series of laser pulses to impinge on a sample, providing a second series of laser pulses having a second duration and a second wavelength, and directing the second series of laser pulses to impinge on a cathode. The method also includes generating a series of electron pulses in response to the impingement of the second series of laser pulses on the cathode and directing the series of electron pulses to impinge on the sample. The method further includes scanning the series of electron pulses across the sample and detecting at least one of secondary electrons or backscattered electrons.

Numerous benefits are achieved by way of the present invention over conventional techniques. For example, embodiments of the present invention provide methods and systems suitable for measuring nano-machines and human cells, providing four dimensional images of the various parts or components of the object being measured. Additionally, embodiments of the present invention provide techniques to measure samples and provide techniques related to 4D electron tomography, which unites the power of volume imaging with time resolution, thereby revealing the structural and morphological dynamics of a 3D object. Thus, embodiments of the present invention provide for the integration of tomography with time, representing the fundamental four coordinates of space and time. These and other embodiments of the invention along with many of its advantages and features are described in more detail in conjunction with the text below and attached figures.

BRIEF DESCRIPTION OF THE DRAWINGS

FIG. 3A illustrates a series of 2D projections of the nanotube specimens taken at several delay times according to an embodiment of the present invention;

FIG. 3B illustrates a series of difference images based on the images in FIG. 3A;

DETAILED DESCRIPTION OF SPECIFIC EMBODIMENTS

Embodiments of the present invention provide methods and systems related to 4D electron tomography. As described more fully throughout the present specification, the fourth dimension (i.e., time resolution) is integrated with the 3D spatial resolution obtained from a complete tilt-series of 2D projections of an object. The different time frames of tomograms constitute a movie of the object in motion, thus enabling the studies of non-equilibrium structures and transient processes. As example structures, carbon nanotubes of a bracelet-like ring structure are imaged, producing 4D tomograms that display different modes of motion, such as breathing and wiggling, with resonance frequencies up to 30 MHz. Embodiments of the present invention enable imaging over the full space-time range opened up by the nanometer-femtosecond resolutions of ultrafast electron tomography.

Embodiments of the present invention provide the ability to visualize the dynamics of a structure by integrating the dimension of time into electron tomograms that spans a whole tilt series. According to some embodiments, the time resolution in every step is high enough to capture the motion of the object reduced to the atomic scale. The simultaneous real space and real time resolutions described herein are using ultrafast electron microscopy (UEM), which has been described, for example, in U.S. Pat. No. 7,154,091 and U.S. Patent Application Publication No. 2010/0108882, commonly assigned, the disclosures of which are hereby incorporated by reference in their entirety. In previous UEM systems, the collected images are a snapshot representing a time frame of the 2D projection of the object under investigation, making invisible the spatial information in the dimension along the optical axis of the microscope. In part, this results from the large focus depth in the specimen.

According to embodiments of the present invention, methods and systems for 4D electron tomography are provided. In one implementation, the tomograms are constructed from nearly 4,000 projections for a whole series of tilt angles and time steps. In order to demonstrate the capabilities of the systems described herein, imaging of multiwalled carbon nanotubes (MWCNTs) was performed, with the time resolution being independent of the video camera response time of milliseconds, thus enabling the visualization of nonequilibrium, fleeting structures on the femtosecond to millisecond time scale. Viewed in time, the 4D tomograms form a movie showing the mechanical motions and morphological dynamics of the nanotubes (e.g., a bracelet-like structure) over time. By using laser-driven impulsive heating, the complex structures imaged exhibit various resonances of motions. Embodiments of the present invention can obtain the frequencies of the resonances and the pertinent segmental structure responsible for their dynamics.

Figure 1A:
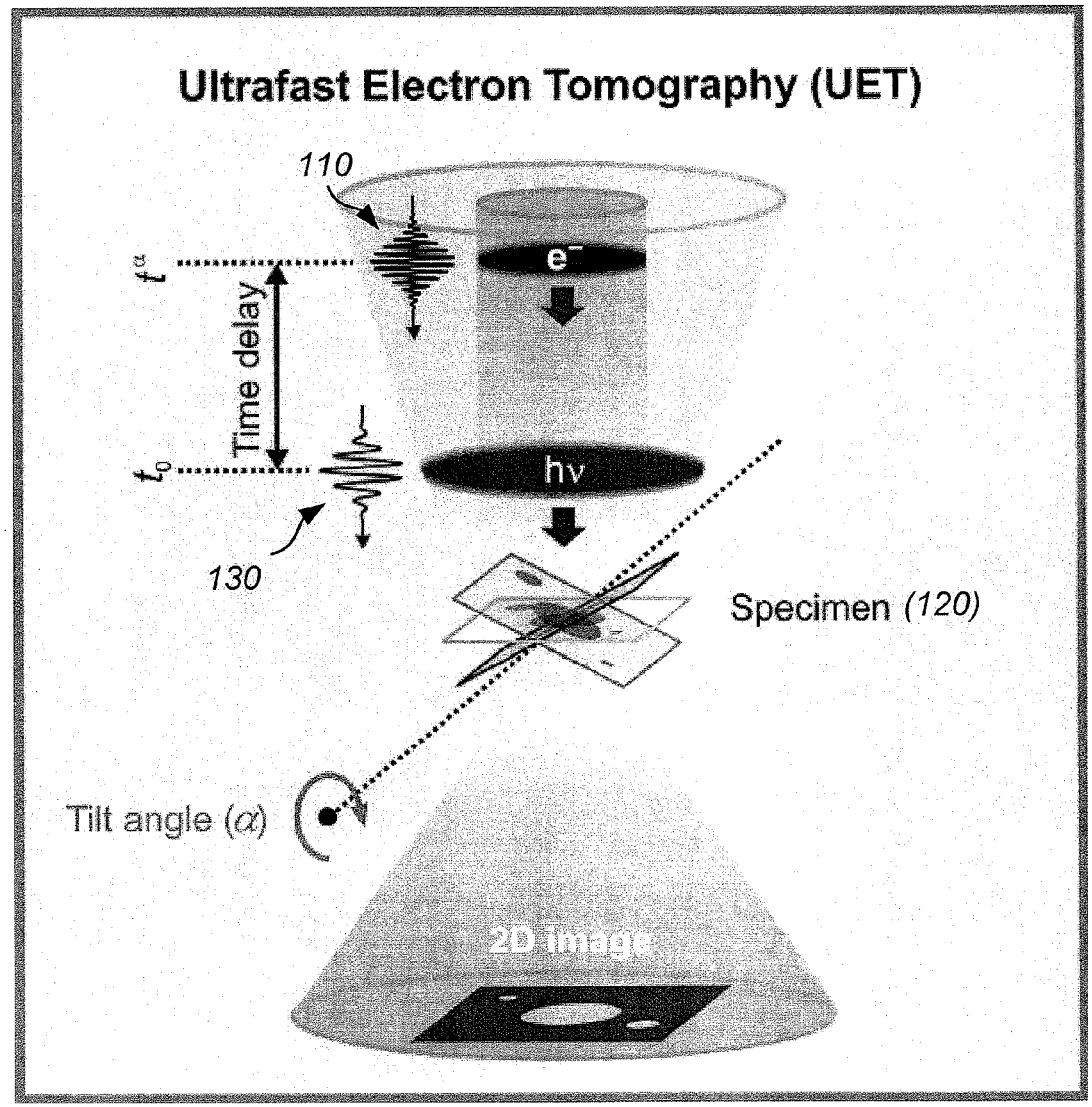
FIG. 1A is a simplified schematic diagram of an ultrafast, time-resolved electron tomography system according to an embodiment of the present invention.

FIG. 1A is a simplified schematic diagram of an ultrafast, time-resolved electron tomography system according to an embodiment of the present invention. Referring to FIG. 1A, an electron pulse 110 is provided and directed toward a specimen 120. The specimen (also referred to as a sample), is mounted on a stage (not shown) that provides for motion of the specimen (i.e., translation and/or rotation). In the illustrated embodiment, the stage is operable to tilt the specimen at a predetermined tilt angle (a) under control of a controller (not shown). As will be evident to one of skill in the art, a feedback system (not shown) is typically implemented to determine and control the tilt angle at a series of predetermined angles. An optical pulse 130 is also directed toward the specimen, with a time delay provided between the optical pulse 130 and the electron pulse 120.

Using the tiltable stage, recording of various 2D projections of the specimen are provided at a given time. Depending on the time scale of the motions involved, images are obtained over a range of tilt angles at a series of time steps in the nanosecond or femtosecond range. As illustrated in FIG. 1A, the optical pulse operates as a heating pulse in some embodiments to initiate (at $t_0$) a structural change and therefore acts as a clocking pulse. The electron pulse arrives at the specimen at a time that is delayed with respect to the optical clocking pulse (time delay $t_\alpha$), thereby producing an image of the structure at a given tilt angle ($\alpha$). In one embodiment, a first laser system is used to provide a signal operable to generate the electron pulse 110, which may be a single electron pulse. The electrons in the illustrated embodiment were accelerated to 200 kV, giving a de Broglie wavelength of 2.5 pm. A second laser system was used to generate the optical pulse 130, which can produce a structural change in the specimen initiated through the application of heat to the specimen. Thus, in the illustrated embodiment, the structural change was initiated through the use of a heating (clocking) pulse and the images were recorded using the electron (probing) pulse. In alternative embodiments, a single laser system and an optical beam-splitter can be used to provide the laser beams used for the optical clocking pulse and generation of the electron pulse.

In order to induce structural change in the specimen in one embodiment, heating was carried out with excitation using a clocking pulse at 519 nm and 532 nm for 220-fs and 10-ns pulses, respectively. The fluence varied from 2.5 mJ/cm$^2$ (for femtosecond measurements) to 100 mJ/cm$^2$ (for nanosecond measurements) and the repetition rate varied from 200 kHz to 3 kHz. Upon the absorption of the pulse energy by the specimen, lattice phonons are formed in a few picoseconds. Consequently, the irradiated region heats up rapidly following phonon-phonon interactions on the time scale of tens of picoseconds. The initial temperature was determined to be 1000° C. from knowledge of the optical and thermal properties of the specimen, the fluence, and using a simple 1D heat flow computation. The impulsive thermal stress induces mechanical vibrations in the material and the initial motions by heat-induced expansion are then transferred into longitudinal and flexural modes in 3D. Embodiments of the present invention provide for imaging of all parts of the object, not just a portion, in all the four dimensions of space and time. As an example, the motion of a complex, heterogeneous structure such as a nano-machine can be measured to show the motion of the various parts in both space and time.

A delay stage is utilized to control the delay time of the electron pulse relative to the heating pulse. The delay stage can be either an optical delay stage for use in the femtosecond mode or an electronic delay stage for use in the nanosecond mode. One of ordinary skill in the art would recognize many variations, modifications, and alternatives. In order to construct each image, a series of optical and electron pulses are provided at a given time delay and tilt angle, constructing each frame stroboscopically in a few seconds.

Figure 1B:
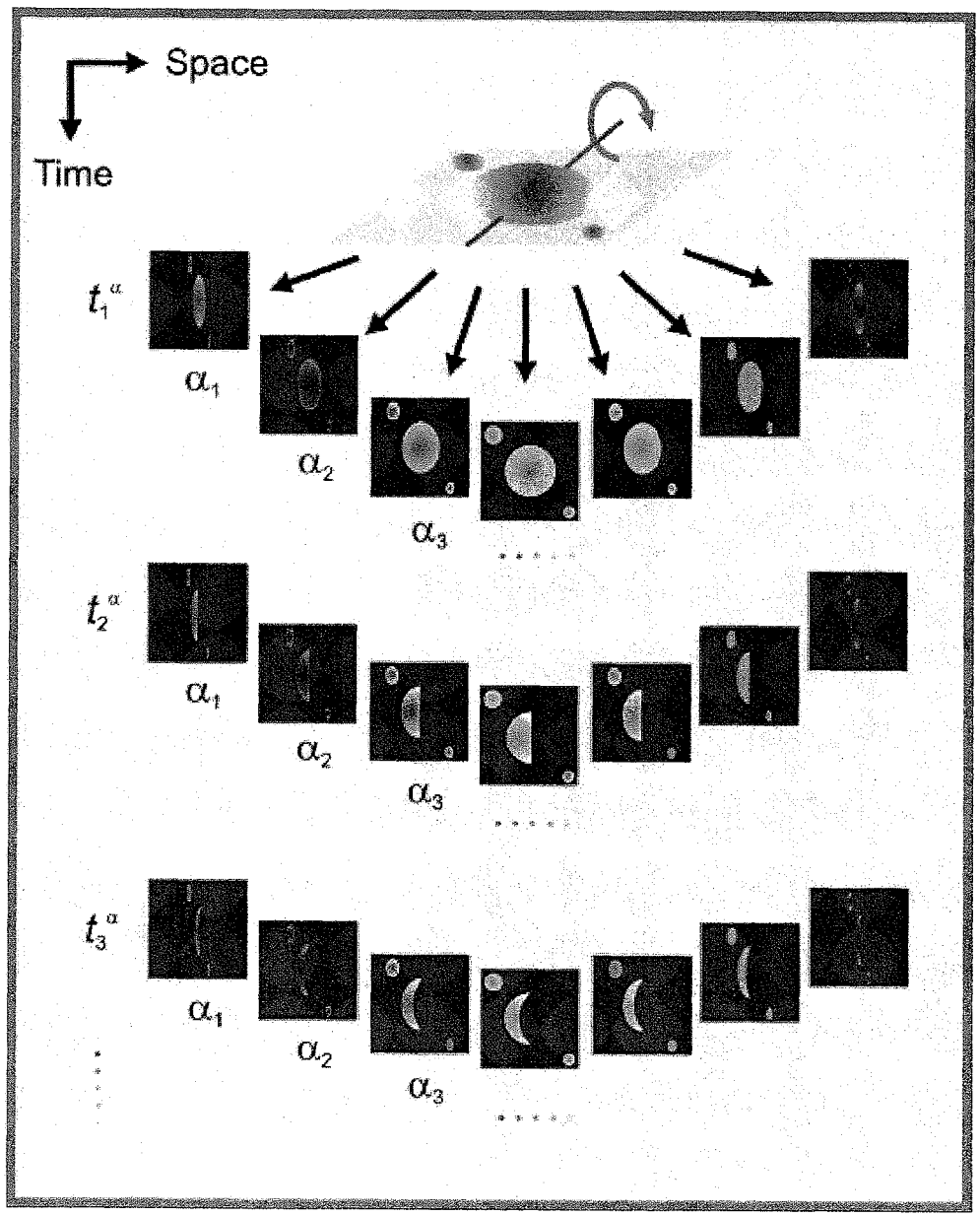
FIG. 1B illustrates images collected as a function of tilt angle and time according to an embodiment of the present invention.

FIG. 1B illustrates images collected as a function of tilt angle and time according to an embodiment of the present invention. As described below, the 2D images collected at different angles and times as illustrated in FIG. 1B are used in constructing the 4D tomograms. It should be noted that at a given time, each 2D projection represents a 3D frame (including time), whereas a 3D tomogram, when constructed from all the 2D projections, represents a 4D frame.

In one embodiment of the present invention, the tilt angle was incremented by steps of 1° over a range from −58° to +58° and the time scale was incremented to provide a time delay ranging from femtoseconds to microseconds. As will be evident to one of skill in these art, these particular angle increments and ranges, as well as these particular time ranges are not required by the present invention and are merely provided by way of example. Other increments and ranges for angles and times are included within the scope of the present invention. Returning to the embodiment discussed above, the number of total spatiotemporal projections made is approximately 4,000, which were then used to construct tomographic movies of the specimen in motion.

As described more fully below, carbon nanotubes were used as specimens and the diffraction contrast in the bright-field images at different tilt angles was nearly absent, thus, satisfying the condition for the projection requirement (i.e., when the contrast in images arises dominantly from changes in specimen density or thickness). Referring to FIG. 1B, a series of bright-field images of various 2D projections are illustrated, each image associated with single-axis tilting of the specimen at a fixed time. These 2D projections were used to construct a 3D tomogram at a predetermined time, $t_i^\alpha$, where i represents the different time steps produced by varying the time delay between the optical and electron pulses and a represents the tilt angle defined with respect to the electron beam. Thus, a 3D tomogram can be constructed for each predetermined time $t_i$. By varying the time delay over a series of predetermined times, a 4D tomogram can be constructed from the 3D tomograms. The stroboscopic build up of the tomogram is useful in this configuration since the specimen returns to the original structure for any of the predetermined tilt angles or times.

In order to generate the tomograms in one embodiment, the tilt series of images were aligned with respect to reference landmarks and a precise tilt axis. Median filtering was used in this embodiment to assist in the image alignment procedure. By using an iterative algebraic algorithm, (e.g., ART or SIRT), the 3D (volume) tomograms were reconstructed from the aligned images. A series of such time frames of 3D tomograms were used to make a movie, which displays the temporal evolution of the morphological and mechanical motions. The resonance and local motions become identifiable from changes in selected volume density of the tomograms. As mentioned above, the time interval between successive clocking pulses can be chosen to ensure complete heat dissipation and damping out of the mechanical motions prior to the arrival of the subsequent clocking pulse.

Figure 2A:
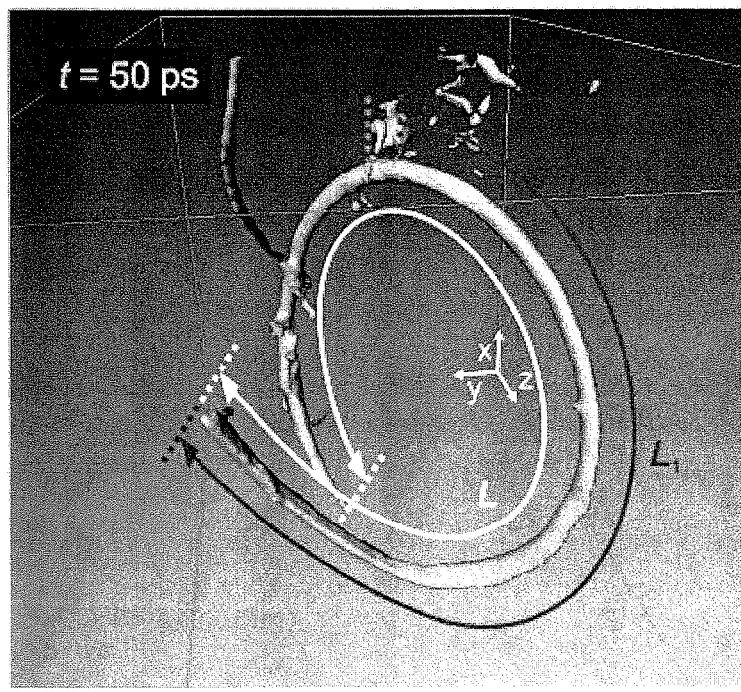
FIG. 2A is a 3D tomogram of a carbon nanotube at a first time according to an embodiment of the present invention.
Figure 2B:
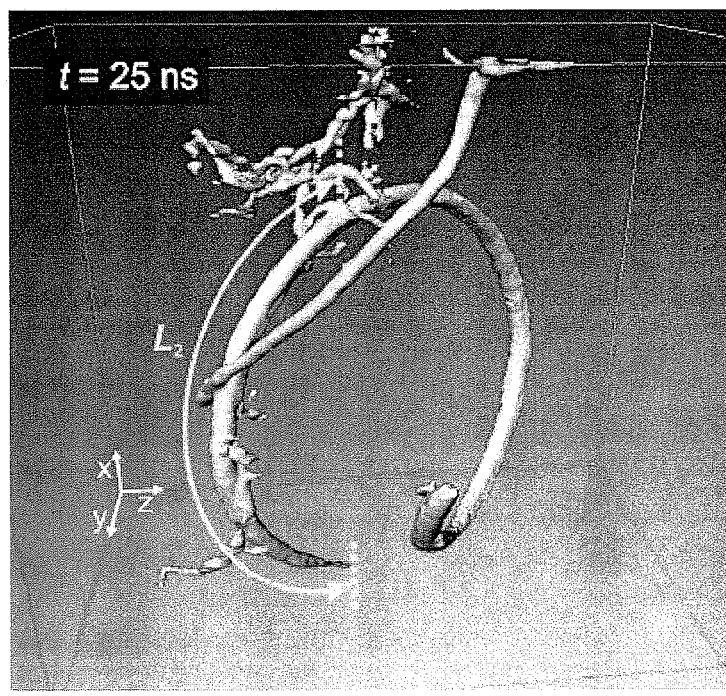
FIG. 2B is a 3D tomogram of the carbon nanotube illustrated in FIG. 2A at a second time according to an embodiment of the present invention.

FIG. 2A is a 3D tomogram of a carbon nanotube at a first time according to an embodiment of the present invention. As indicated in FIG. 2A, the 3D volume image of the MWCNT specimen is taken at a time delay of 50 ps. FIG. 2B is a 3D tomogram of the carbon nanotube illustrated in FIG. 2A at a second time according to an embodiment of the present invention. As indicated in FIG. 2B, the 3D volume image of the MWCNT specimen is taken at a time delay of 25 ns.

Referring to FIGS. 2A and 2B, the bracelet shape (i.e., microscale spiral ring) of the nanoscale tubular structure is characterized by a 620-nm radius and the detailed tubular morphology is clearly displayed. Based on computations using the 3D volume models, the length of the ring (L) was measured to be 4.4 µm. Around the anchored region of the ring, L1 gives the length for one long segment and L2 for the shorter one. The 3D isosurface rendering was made using the Amira visualization program although other visualization programs can be utilized. Thus, utilizing embodiments of the present invention, tomographic reconstructions are provided and bright-field imaging is used to reproduce the object structure while preserving the morphology of the specimen.

Figure 2C:
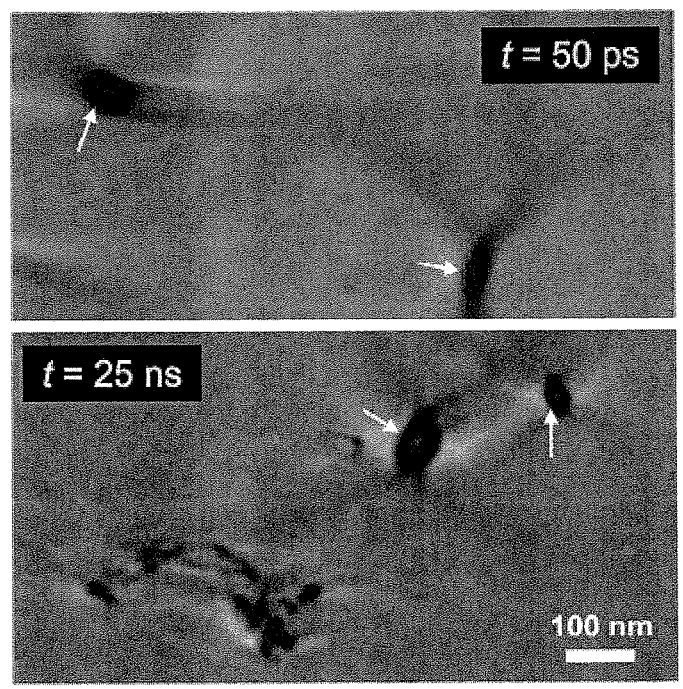
FIG. 2C illustrates cross sections of the 3D tomographic images of carbon nanotube specimen at two times according to an embodiment of the present invention.

FIG. 2C illustrates cross sections of the 3D tomographic images of carbon nanotube specimen at two times according to an embodiment of the present invention. The cross sections are taken at the times of 50 ps and 25 ns as used in FIGS. 2A and 2B, respectively. Referring to the images taken at the 50 ps and 25 ns times, 4.6-nm thick 2D slices are illustrated, in the XY plane, perpendicular to the optical axis (i.e., a projection image at $\alpha=0°$). At this magnification and binning, the single-pixel resolution is 4.6 nm. It should be noted that the dark regions indicated by arrows represent nm-thick carbon walls and the light area represents vacant space in the tomograms. Using embodiments of the present invention, tubular features with hollow channels of ~10 nm±2 nm diameters are well resolved.

Figure 2D:
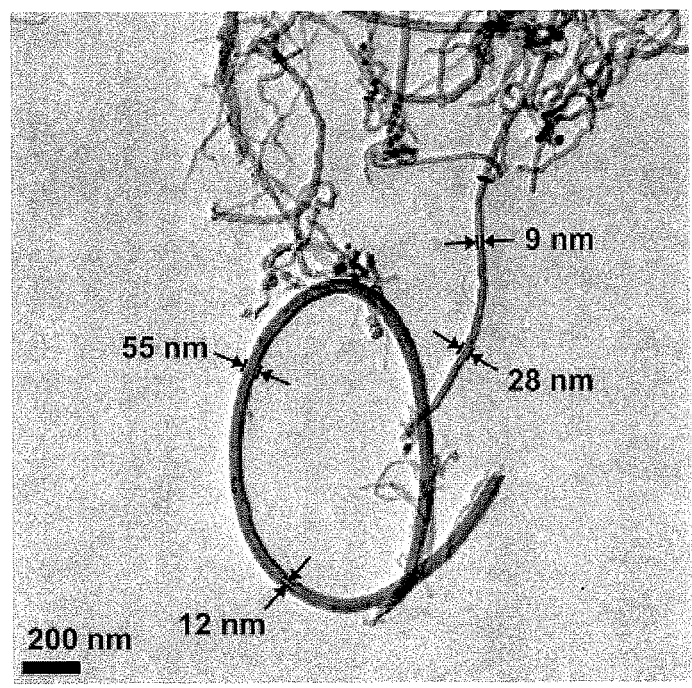
FIG. 2D illustrates a TEM image of a MWCNT specimen according to an embodiment of the present invention.

FIG. 2D illustrates a TEM image of a MWCNT specimen according to an embodiment of the present invention. The image in FIG. 2D is obtained at an angle of α=0° and confirms the general structure of the specimen. As shown, the bracelet is supported by other nanotubes, without a substrate, and have features that are consistent with the reconstructed tomograms. Using images at higher magnifications, it was determined that the thickest tube has an average outer diameter of 55 nm and inner diameter of 12 nm for a hollow channel and a narrower tube has an outer diameter of 28 nm and an inner diameter of 9 nm. From the tomographic volume reconstruction, it was determined that the 28-nm thick tube was attached to the spiral tube having a diameter of 55 nm as illustrated in FIG. 2A.

FIG. 3A illustrates a series of 2D projections of the nanotube specimens taken at several delay times according to an embodiment of the present invention. The dynamics of the specimen are illustrated by the snapshot images recorded stroboscopically at different time delays, which are indicated at the top right corner of each image.

FIG. 3B illustrates a series of difference images based on the images in FIG. 3A. The difference images in FIG. 3B are relative to the frame at t=−50 ns and show projected motions of the MWCNT specimen. In the difference images, the regions of white or black indicate the motions involved, whereas the gray regions indicate that the contrast is unchanged from that of the reference frame. The scale bar in the lower left corner of each frame measures 200 nm. At positive times spanning the ns and microsecond (μs) time regime (i.e., following t=0), visual changes are clear in the difference images. With time, the bracelet begins to move following the heating pulse, and with these and other micrographs of equal time steps, it is possible to make a movie of the mechanical motions.

No noticeable change were observed in images obtained before the arrival of the heating (i.e., clocking) pulse, indicating that the bracelet had returned to its original spatial configuration. Moreover, due to the fact that each time frame is formed stroboscopically by accumulating a number of snapshots (e.g., $10^4$ snapshots at a repetition rate of 3 kHz for a few seconds in one embodiment), the revealed motion is reversible, reverting to the at-rest position after each heating pulse. There was no sign of structural fatigue or deformation observed during the course of the measurements performed. The average dose for each 2D projection image was ~15 $e^-/nm^2$ at the maximum number of electrons in the nanosecond pulse. For the femtosecond pulse, this number is down by two orders of magnitude. The total dose for the entire tomographic recording is <$10^5$ $e^-/nm^2$, which is at least two orders of magnitude smaller than that reported for causing deformation of MWCNTs.

Figure 3C:
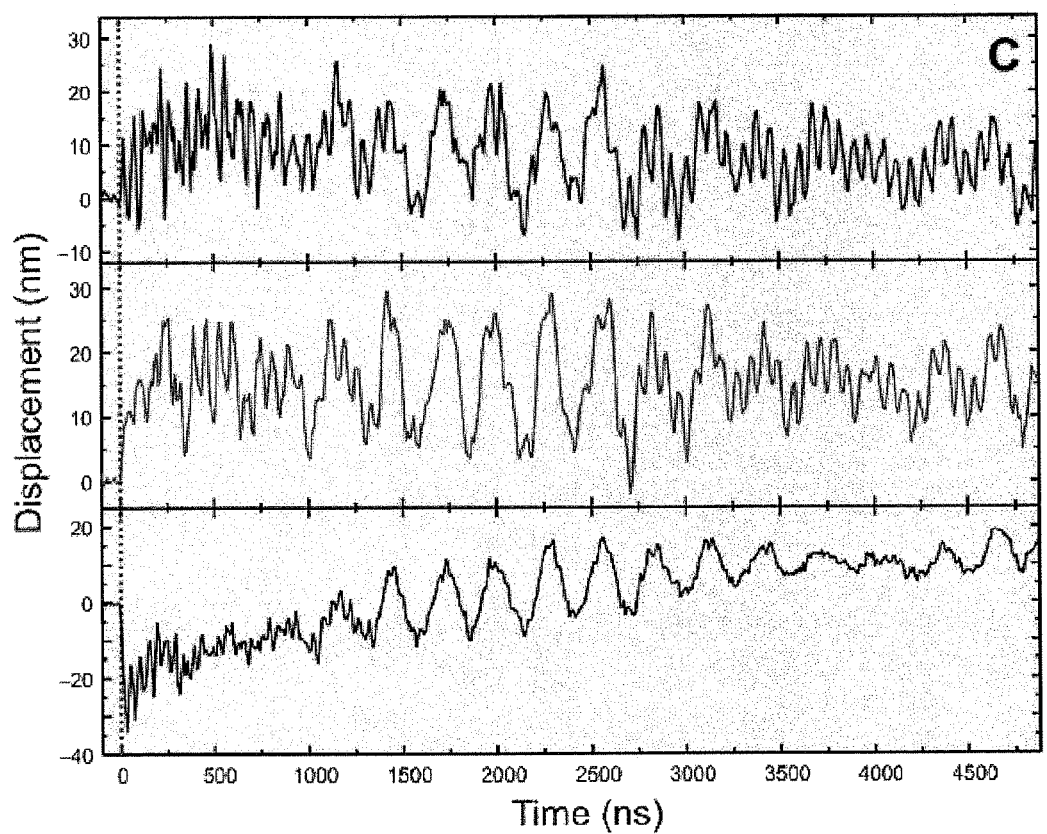
FIG. 3C illustrates the displacement of the nanotube specimens at three transverse cross-sections according to an embodiment of the present invention

FIG. 3C illustrates the displacement of the nanotube specimens at three transverse cross-sections according to an embodiment of the present invention. As illustrated in FIG. 3C, oscillatory motions are evident for transverse cross-sections of the MWCNT specimen indicated by arrows in the image at t=−50 ns in FIG. 3A. Displacements for the top arrow pointing to the right in FIG. 3A are illustrated by the middle displacement frame in FIG. 3C, displacements for the middle arrow pointing down and to the right in FIG. 3A are illustrated by the top displacement frame in FIG. 3C, and displacements for the lower arrow pointing up and to the right in FIG. 3A are illustrated by the bottom displacement frame in FIG. 3C. Referring to FIG. 3C, the temporal behavior obtained from the 2D images indicates an oscillatory behavior in the displacement from the original position along the transverse directions of the tube.

Figure 3D:
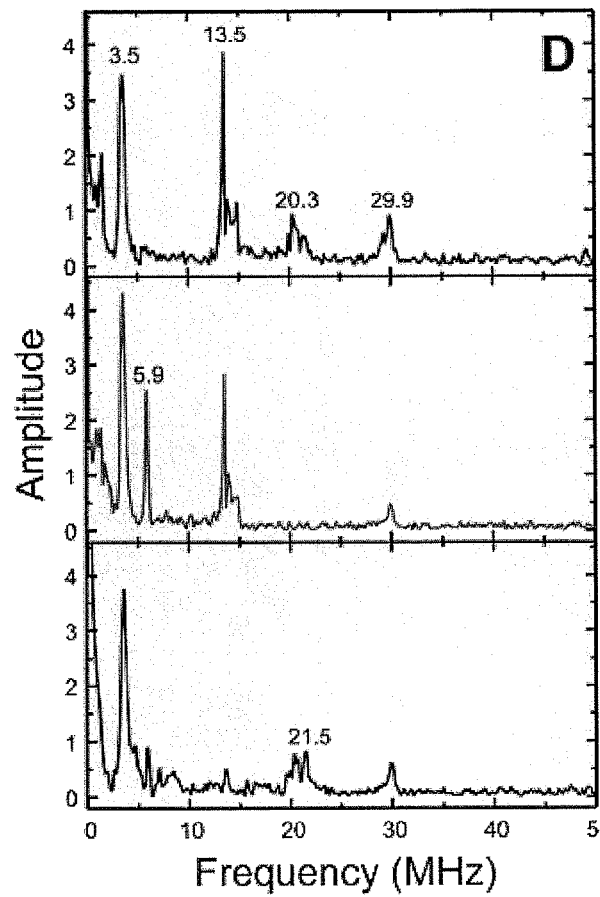
FIG. 3D illustrates Fast Fourier transforms of the displacements illustrated in FIG. 3C according to an embodiment of the present invention.

FIG. 3D illustrates Fast Fourier transforms of the displacements illustrated in FIG. 3C according to an embodiment of the present invention. As shown by FIG. 3D, the oscillations of the nanotube have well defined resonance frequencies of 29.9, 13.5, 5.9 and 3.5 MHz and some near 21 MHz, depending on the portion of the nanotube analyzed. In order to obtain the frequency data in FIG. 3D, temporal data in the time regime of 0-4.9 us with a sampling rate of 10 ns for each of the displacements was used. After 1 μs, the two prominent modes at 13.5 and 3.5 MHz survive. Because the images are 2D representations of an originally-imaged 3D structure in motion, display of the modes involved are complicated, most likely resulting from wiggling around the anchored tubes and/or from the breathing resonance of the ring.

Figure 4A:
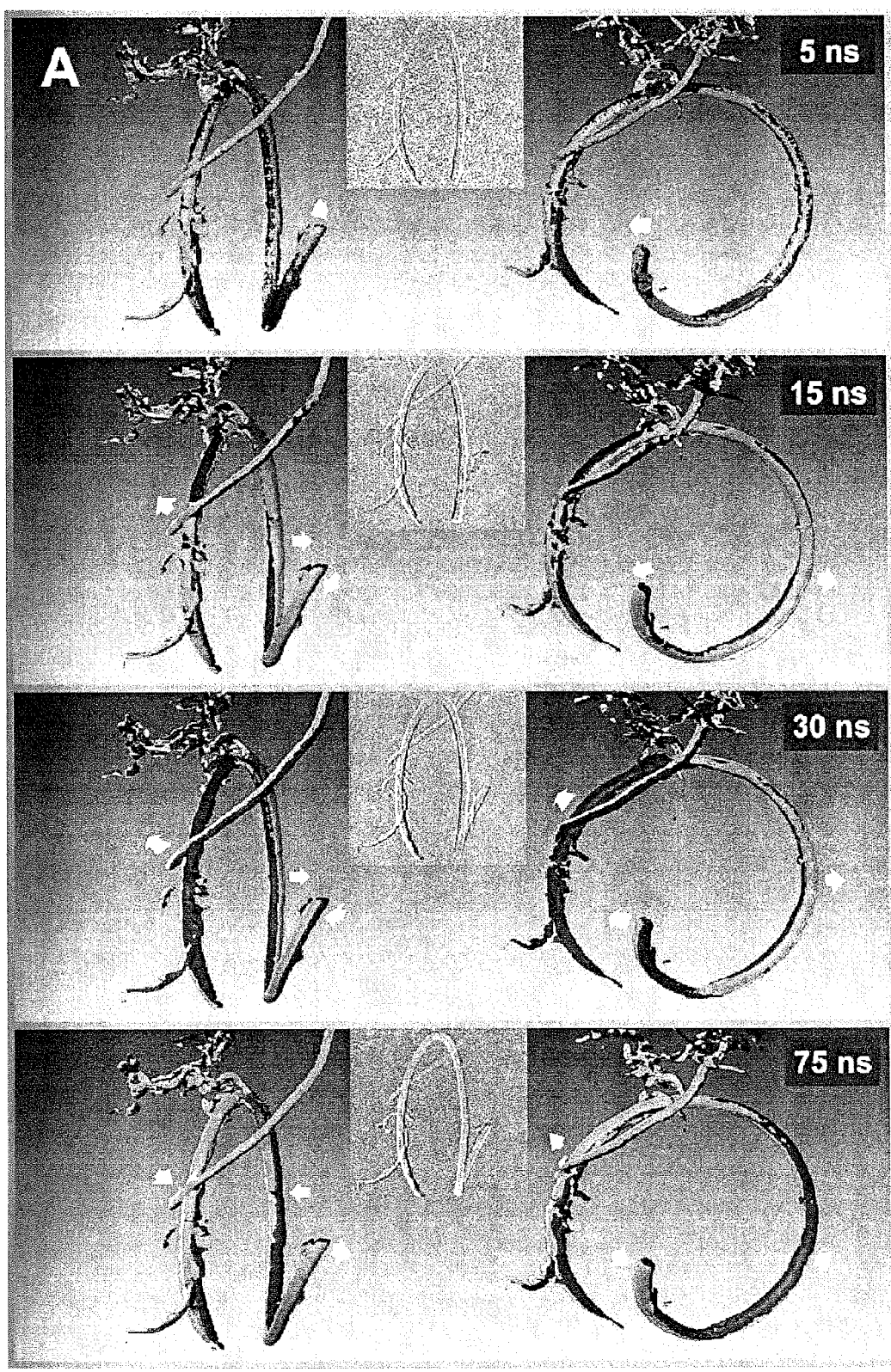
FIG. 4A illustrates representative 3D volume snapshots of the nanotubes according to an embodiment of the present invention.

FIG. 4A illustrates representative 3D volume snapshots of the nanotubes according to an embodiment of the present invention. The snapshots illustrated in FIG. 4A are obtained at relatively early times (i.e., 5 ns, 15, ns, 30 ns, and 75 ns in these snapshots). Each 3D rendered structure is illustrated at a different time delay (beige) and is given for two different view angles. The tomograms illustrated at each time delay were generated from the sets of 2D projections taken at a series of tilt angles with steps of 1° over a range extending from −58° to +58° although other step sizes and angular ranges are included within the scope of the present invention. In an alternative embodiment, movies of 2D projections were constructed based on images taken at different tilt angles of −55°, 0°, and +55°. A reference volume model taken at t=0 ns (black) is merged in each panel to highlight the resolved nanometer-scale displacements. Arrows are shown in each panel to indicate the direction of motion.

The extent of displacement may vary depending on the tilt angle, because the local thickness of the specimen along the axis of the excitation may change. However, the skin depth of the MWCNT ring specimen for the 532-nm light was computed to be 2 μm [absorption coefficient, $\alpha=1.0\times10^4$ $cm^{-1}$] which exceeds the largest local thickness along the ring specimen at the tilt angle of 35°. In addition, the absorption cross-section of MWCNTs is reported to be weakly dependent on the polarization of the incident beam for thick tubes. To further suppress any polarization dependence, the polarization of the optical excitation beam was set to be not along the long axis of the tube. Consequently, the heat gradient and thermal stress is uniform for the tilt angles discussed herein.

Figure 4B:
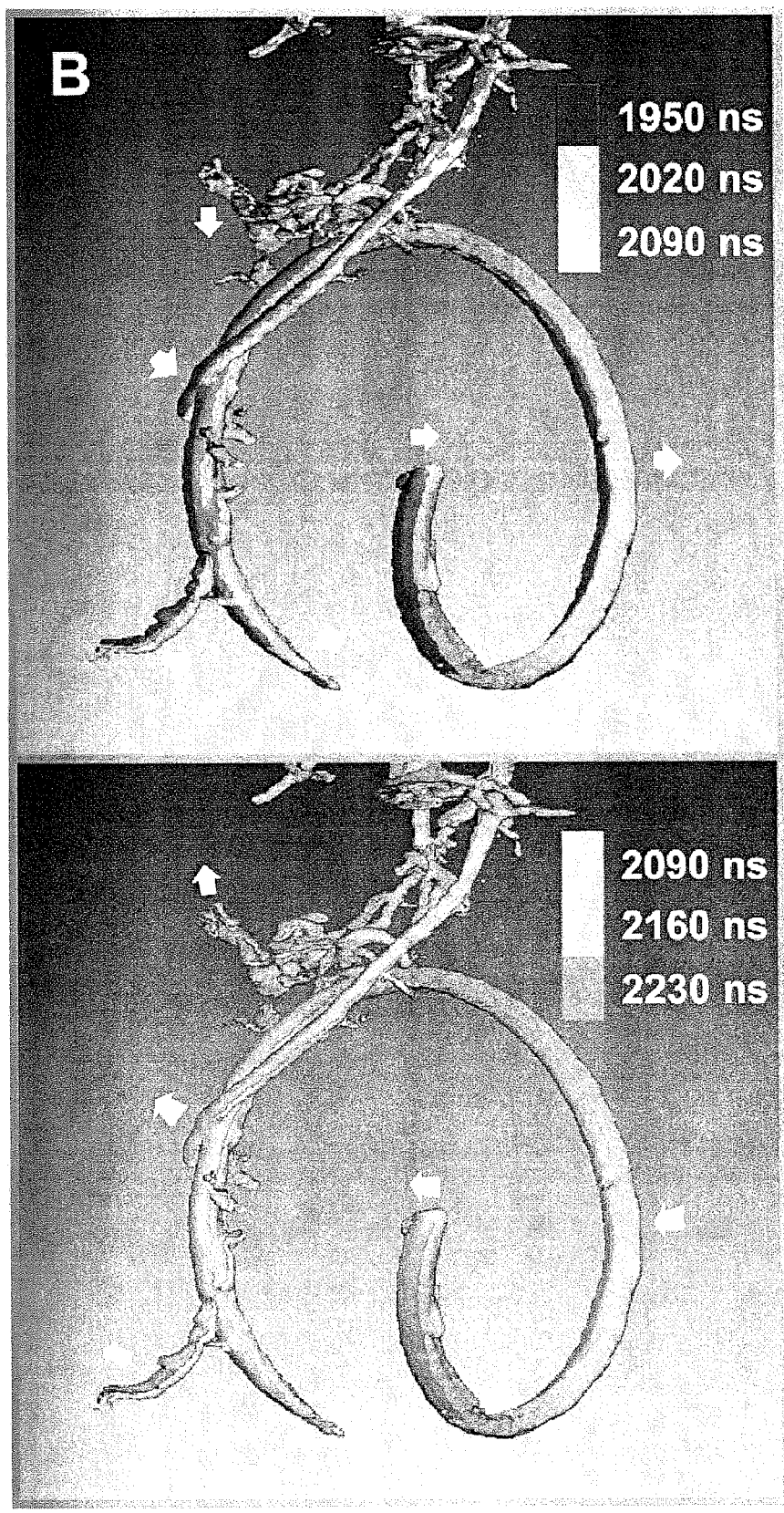
FIG. 4B illustrates a 4D tomographic illustration of the nanotubes illustrated in FIG. 4A at longer timer periods.

FIG. 4B illustrates a 4D tomographic illustration of the nanotubes illustrated in FIG. 4A at longer timer periods. As illustrated in FIG. 4B, the time-dependent structures were visualized at later times and with various colors to indicate different temporal evolution. The wiggling motion of the whole bracelet is highlighted with arrows.

From the reconstructed 4D tomograms in FIGS. 4A and 4B, it is possible to visualize the complicated motions and dissect some normal modes in 3D coordinates. As shown in FIG. 4A and FIG. 4B, there are two prominent time scales of the motion. At the early times illustrated in FIG. 4A, the volumes in black describe the original configuration of the object, whereas those in beige depict the new configuration displaced from the original position. One can identify the early-time resonance "breathing-type" motion, because by 75 ns the reversal for the volume density of the bracelet was obtained. At the longer times illustrated in FIG. 4B, the bracelet resonates on a slower time scale and the reversal of the motion is clear, as highlighted by changes in color-coding and by the directions of arrows shown in FIG. 4B.

Referring to FIG. 4A, at t=5 ns the two ends of the ring begin to move. At t=15 ns, the displacement of the specimen from the at-rest position is observed for the whole ring. At t=30 ns, the bending motion of the ring is revealed as the two ends move in the same direction, whereas the middle part of the ring does so in the opposite direction. This bent ring configuration restores the structure nearly to its original position at t=75 ns. It should be noted that the time scale of motions revealed in the tomograms tracks those obtained independently using 2D images at a given tilt angle (e.g., α=0°) as shown by the difference images in FIG. 4A.

Referring to FIG. 4B, on the microsecond time scale (e.g., from 1950 ns to 2090 ns), the bracelet wiggles as evident from changes in the volume density, which shows displacement in the same direction. In the following 140 ns, the direction of motion is reversed, revealing that the resonance motion is a wiggling of the whole bracelet around the anchored position.

The breathing period of ~70 ns corresponds to the 13.5 MHz resonance obtained in the FFT analysis shown in FIG. 3D. To estimate the Young's modulus (Y) of the nanotube, we assumed that the frequencies of the open ring are derivable from a beam undergoing bending motions. This assumption is justified when one notices the direction of displacement shown, for example, at t=30 ns in FIG. 4A. The Euler-Bernoulli equation for elastic beams with natural frequencies, $f_n$, is given by the following equation, $$f_n = \frac{\beta_n^2}{8\pi L^2} \sqrt{\frac{(D_o^2 + D_i^2)Y}{\rho}},$$

where L, $D_o$, $D_i$ and $\rho$ denote the length, the outer diameter, the inner diameter and the density of the MWCNT, respectively. $\beta_n$ is a constant for the $n^{th}$ mode. For simplicity, the free ends boundary condition was adopted with $\beta_1$=4.730.

For an outer diameter $D_o$=55 nm, inner diameter $D_i$=12 nm, and length L=4.4 μm, all easily retrieved from the images, and using the observed value of $f_1$=13.5 MHz, Young's modulus was calculated to be 61 GPa. This value is in the range reported for carbon nanotubes, from ~1 TPa for Do<10 nm to ~100 GPa for nanotubes of larger diameter. For bent nanotubes, smaller Y values are expected because of wrinkle or ripple on the inner arc. Given the value of Y=61 GPa and using the boundary condition of a clamped-free beam ($\beta_1$=1.875), the frequencies for segments of the bracelet were computed: for $L_1$=1.4 μm and $L_2$=2.8 μm (see FIG. 2A), frequencies of 5.3 and 21.4 MHz are obtained, respectively. These frequencies are in agreement with those obtained (5.9 and ~21 MHz) in the FFT analysis shown in FIG. 3D, supporting the assignment of the 13.5 MHz to the global motion of the ring and the others to local ones. The tomographic visualization in FIG. 4B indicates that the oscillation at 3.5 MHz (period=300 ns) is due to the wiggling motion of the ring that is supported by the bundle of nanotubes shown in the tomograms. It should be noted that thermal vibrations give rise, from room temperature to 1000° C., to amplitudes ranging from 0.5-1.0 nm, in contrast to the large amplitudes of tens of nanometers measured here for heating in the far-from-equilibrium state.

Embodiments of the present invention provide methods and systems for 4D electron tomography, which unites the power of volume imaging with time resolution, thereby revealing the structural and morphological dynamics of a 3D object. As described throughout the present specification, embodiments of the present invention enable the 4D tomographic imaging of a complex ring structure in a non-equilibrium state, displaying the motions in different parts of the object on various time scales. The modes measured herein include breathing, due to segmental bending, as well as wiggling of the ring around a tethered position. Thus, embodiments of the present invention provide for the integration of tomography with time, representing the fundamental four coordinates of space and time.

Figure 5:
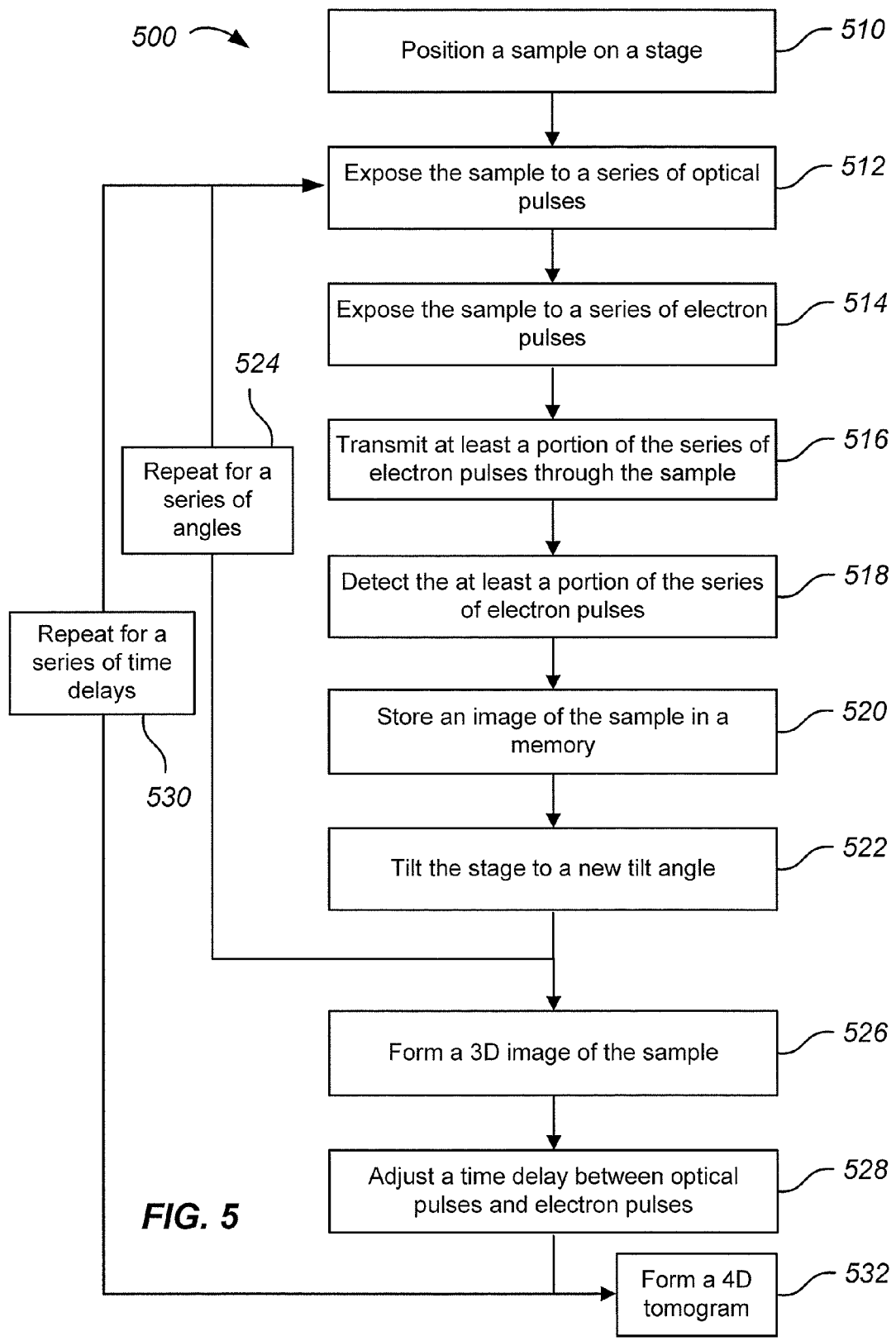
FIG. 5 is a simplified flowchart illustrating a method of obtaining 4D electron tomography images according to an embodiment of the present invention.

FIG. 5 is a simplified flowchart illustrating a method of obtaining 4D electron tomography images according to an embodiment of the present invention. The method 500 includes positioning a sample on a stage having one or more degrees of freedom (510). The stage is characterized by a tilt angle. As described below, the stage will be oriented at a series of tilt angles during operation of the method. The method also includes exposing the sample to a series of optical pulses (512) and exposing the sample to a series of electron pulses (514). As described herein, the series of optical pulses provide initiating pulses to the sample. In some embodiments, these optical pulses are referred to as heating pulses since they can initiate a cycle of reversible changes in the shape, morphology, or the like of the sample. The timing of the optical/electron pulses is such that the sample will return to its original unchanged state prior to the arrival of the subsequent optical/electron pulse. Exposing the sample to a series of electron pulses is accomplished by irradiating a cathode with a set of laser pulses in some embodiments. Utilizing this method, ultrafast electron pulses can be produced with pulse widths on the femtosecond scale.

The method further includes transmitting at least a portion of the series of electron pulses through the sample (516) and detecting the at least a portion of the series of electron pulses using a two-dimensional detector (518). Using the detected electrons, an image of the sample is stored in a memory (520). The image is a two-dimensional image of the sample.

The method additionally includes tilting the stage to a new tilt angle (522) and repeating steps 512 through 520 for a series of tilt angles (524). In an embodiment, the tilt angles cover a range of over 100°, for example, from −58° to +58°. Other ranges of angles are provided according to other embodiments of the present invention. In addition to tilting of the stage, the method includes translating the sample in a plane orthogonal to a direction of propagation of the electron pulses.

Using the stored two dimensional images associated with various tilt angles, a three-dimensional image of the sample is formed (526) and a time delay between pulses of the series of optical pulses and pulses of the series of electron pulses is adjusted (528). In some embodiments, the time delay is adjusted by use of an optical delay stage that advances or retards the pulses of the optical pulse train with respect to the electron pulses of the electron pulse train. In other embodiments, the optical delay stage is utilized to advance or retard the optical beam used to generate the electron pulses. One of ordinary skill in the art would recognize many variations, modifications, and alternatives. In other embodiments, an electronic delay stage is utilized when the time delays are suitable for such methods (e.g., nanosecond delays). The method also includes repeating steps 512 through 528 for a series of time delays (530). Using the 3D images associated with the various time delays, a 4D tomogram is formed (532).

It should be appreciated that the specific steps illustrated in FIG. 5 provide a particular method of performing 4D electron tomography according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

According to embodiments of the present invention, methods and techniques related to scanning ultrafast electron microscopy (SUEM) are provided. As discussed throughout the present specification, SUEM can be performed using a field-emission-source configuration. In an embodiment, scanning of pulses is made in the single-electron mode, for which the pulse contains at one or a few electrons, thus achieving imaging either without or with a reduction in the space-charge effect between electrons. Even in single-electron mode, images are obtained in tens of seconds or less. For imaging, the secondary electrons from surface structures are detected, for example, for material surfaces, biological specimens, and the like. By recording backscattered electrons (which are mainly the result of inelastic scattering), diffraction patterns from single crystals can also be obtained. Thus embodiments of the present invention provide scanning pulsed-electron microscopy systems providing high spatiotemporal resolution with efficient heat-dissipation that are suitable for achieving in situ 4D imaging with an environmental capability.

As described more fully below, in an embodiment, an ultrashort electron pulse train was generated from a cold field-emission source and used in scanning mode for imaging and diffraction. SUEM systems provide nanometer and sub-ps spatiotemporal resolution through the detection of secondary and backscattered electrons. Applications for SUEM include imaging of various specimens at different magnifications including imaging 3D surface structures of materials, biological systems, and the like.

Ultrafast electron microscopy (UEM) techniques have been developed for imaging in both space and time with atomic-scale resolutions. Some UEM systems use single-electron packets, which provide high spatiotemporal resolutions due to the absence of the space-charge effect between electrons. Using femtosecond (fs) optical pulses, electrons are generated from a $LaB_6$ photocathode and then accelerated, for example, to 200 keV. The time resolution is independent of the response of the video camera, as it is determined by the duration of the initial heating and electron pulses. With UEM, different domains of electron microscopy have been explored, including real-space imaging, diffraction, electron-energy-loss spectroscopy, 4D electron tomography, convergent-beam diffraction, and near-field electron microscopy.

SEM provides the capability of obtaining 3D-like images for materials surfaces. Moreover, environmental microscopy can easily be invoked. Significantly, the electron source in SEM, a field emitter with a tip dimension of tens-to-hundreds of nanometers (nm), has higher brightness than that of the source in UEM ($LaB_6$), which has an active-area dimension of tens of micrometers ($\mu m$). Finally, the specimen is easier to handle and thick samples can be used, thereby providing a mechanism for heat dissipation, useful when the heating pulse is involved in dynamic studies.

According to embodiments of the present invention, SUEM systems are provided in which the spatial resolution is that of SEM and the time resolution is determined by the ultrashort pulses involved, not by the deflection rate or the streak camera used for optical detection. Unlike conventional methods in which the electron pulse induces the carrier excitations, the electron pulses herein are the probes for imaging through the resultant secondary electrons. In this regard, pump-probe systems are provided with pixel-by-pixel recording.

In diffraction implementations, Bragg spots or Debye-Scherrer rings, which are the dominant features of UEM diffraction, are replaced by Kikuchi lines when electron back-scattering diffraction (EBSD) patterns are recorded in SUEM. As such, they are useful in resolving the structural evolution in a crystalline grain or domain along different crystallographic directions. Embodiments of the present invention utilize a cathode including a zirconium-oxide-coated sharp tungsten tip, which is a Schottky-emission gun in the relatively low-fluence regime (reaching field emission in the high-fluence limit) and is different from $LaB_6$ tips. When operated in the conventional continuous emission mode (hereafter referred to as the SEM mode), these field-emission sources are orders of magnitude higher in brightness ($10^{11}$-$10^{12}$ $A/m^2/sr$) than $LaB_6$. Thus, embodiments provide a significant improvement in the source's coherence width.

As described below, the source emitter is side-illuminated by a focused femtosecond pulse of well-defined polarization, and the photoemitted electron pulse is the probe in the imaging and diffraction recordings. Applications of the present invention include imaging of biological and nanostructured materials over a wide range of magnification. SUEM using pulsed electrons enables diffraction patterns to be obtained by detecting the backscattered electrons (e.g., for a silicon wafer) displaying the expected Kikuchi lines.

Figure 6:
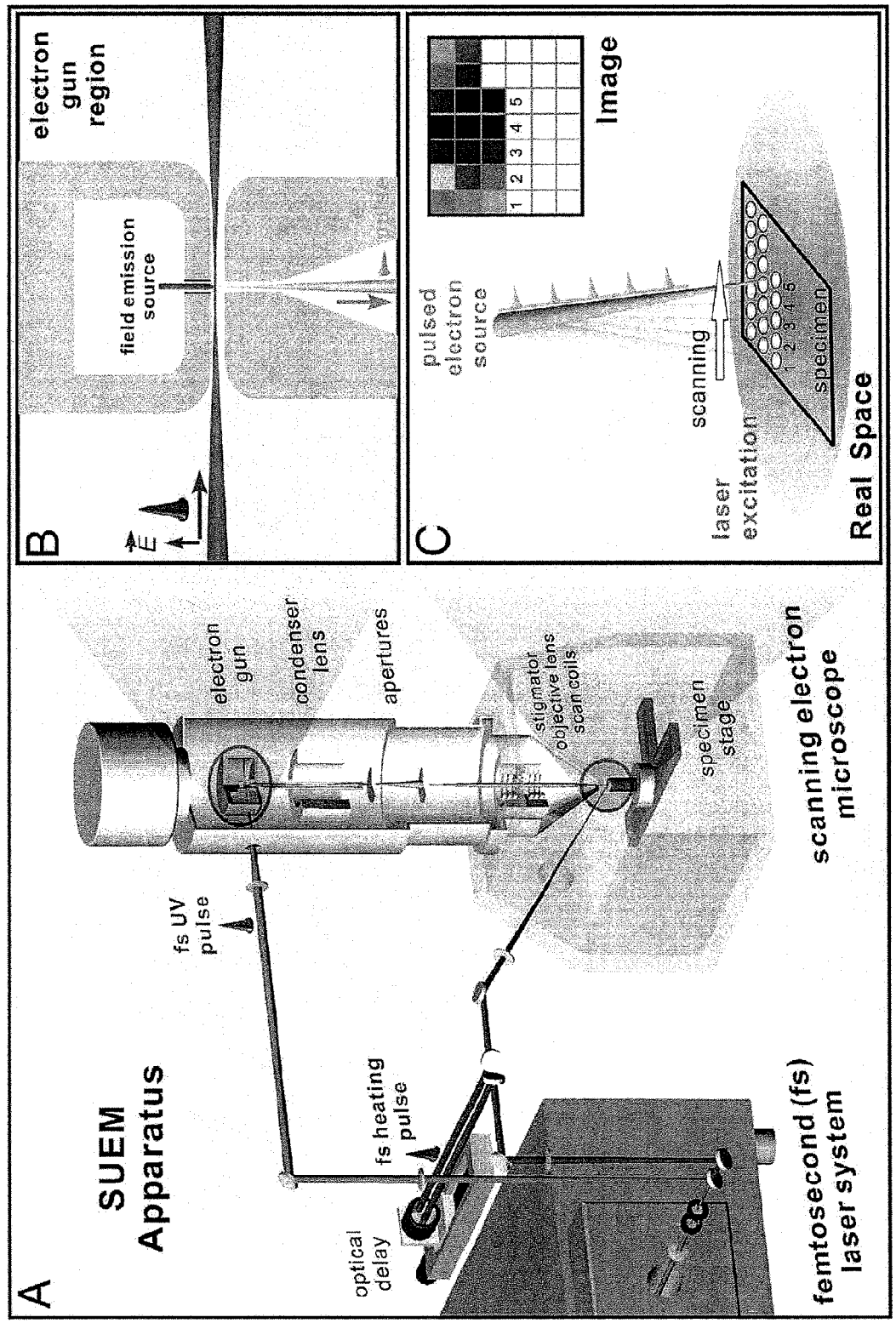
FIGS. 6A-C are simplified schematic diagrams of a SUEM system according to an embodiment of the present invention.

FIGS. 6A-C are simplified schematic diagrams of a SUEM system according to an embodiment of the present invention. Referring to FIG. 6A, the integration of a femtosecond laser system with an electron microscope column with a field-emission source design is illustrated. The illustrated optical system includes a higher-power fiber laser system that operates at variable repetition rates, for example, from 200 kHz to 25.2 MHz. The illustrated laser delivers femtosecond infrared pulses with an average power of up to ~20 W, the wavelength is centered at 1030 nm, and the pulse width is less than 300 fs. In other embodiments, other laser systems with different performance parameters are utilized and the illustrated laser system is exemplary.

The infrared output is frequency doubled and tripled (or quadrupled or the like) in a set of two nonlinear crystals (e.g., BBO crystals) so that the optical pulses (e.g., at 515 nm) can be used in dynamics initiation in the specimen while the 343 nm (or 257 nm) pulses can be used for the generation of the electron pulse train. The ultraviolet light is separated and directed by dichroic mirrors and tightly focused by a 125 mm focal lens onto the tip of the electron emitter. At 25.2 MHz, the average pulse energy of the ultraviolet beam reaches ~2 nJ, before entering the microscope, resulting in an energy density of $F_{laser}$~1 $mJ/cm^2$ at the emitter tip. FIG. 6B illustrates a close-up view of the field-emission region. FIG. 6C illustrates a close-up view of the probe region and a schematic for the pixel-by-pixel image construction. The axis of time is introduced by adjusting the arrival time of the laser excitation pulse at the specimen relative to that of the electron probe pulse using a variable optical delay line.

The scanning mechanism utilized in SEM systems was utilized with an electron acceleration voltage of up to 30 kV. As mentioned earlier, the cathode in the illustrated embodiment is a zirconium-oxide-coated tungsten [$ZrO_x$/W(100)] tip of several hundred nanometers in diameter. The work function is lowered by the $ZrO_x$ coating from 4.5 eV to ~2.8 eV at high temperatures. In the presence of an electrostatic field of $|E_{DC}|\sim 10^7$ V/cm, the effective work function is further lowered by ~1.2 eV due to the Schottky effect and by a small fraction (~0.06) of an eV for the 343 nm excitation. Therefore, electrons overcome this energy barrier through the absorption of the ultrafast photons, and not by the thermal effect, as demonstrated by the results shown below.

Polarization of the ultraviolet beam is adjusted by embodiments of the present invention relative to the tip axis through a half-wave plate to maximize the pulsed current. The photoelectron trajectories follow the pathways that are defined by the components of the electron optics, including the condenser lenses, stigmator, scan coils and the objective lens. After exiting the polepiece and entering the specimen chamber, the focused pulsed electron beam is directed by the scan coils and rasters across a specified region of the specimen to form an image as illustrated in FIG. 6C.

Image construction is achieved through the scanning process with a well-defined dwell time for each beam location. Mapping over discrete pixels in the information space is performed, through a one-to-one correspondence with the set of beam locations on the specimen. The electron-matter interaction results in various types of signals, such as secondary and backscattered electrons as well as X-rays, and these are recorded by different detectors. In an embodiment, secondary-electron images are obtained by a positively biased Everheart-Thornley detector and EBSD patterns are recorded by a high-sensitivity digital camera. Of course, other detectors are included within the scope of the present invention.

To initiate a dynamical change in the specimen, a clocking pulse is introduced. As illustrated in FIG. 6A, a second window is included to permit the entry of such clocking pulses into the chamber and an optical delay stage is used to control the arrival times of the initiating and electron pulses at the specimen. As illustrated in FIG. 6A, embodiments of the present invention provide the functionality of a scanning electron microscope with a clocking pulse, useful because of the high temporal resolution provided by the systems described herein. Thus, high-resolution, time-resolved images are obtained using embodiments of the present invention.

Embodiments of the present invention are applicable to a wide variety of specimens, including, without limitation, biological specimens including an ant; leukocytes (white blood cells) and erythrocytes (red blood cells) coated with a silver layer of a few nanometers thickness (by vapor deposition); organic specimens including uncoated multiwalled carbon nanotubes suspended on a copper grid; and inorganic specimens including aligned zinc oxide nanowires grown on a substrate. The EBSD patterns were from a crystalline Si(001) wafer with a thin layer of native oxide.

Figure 7:
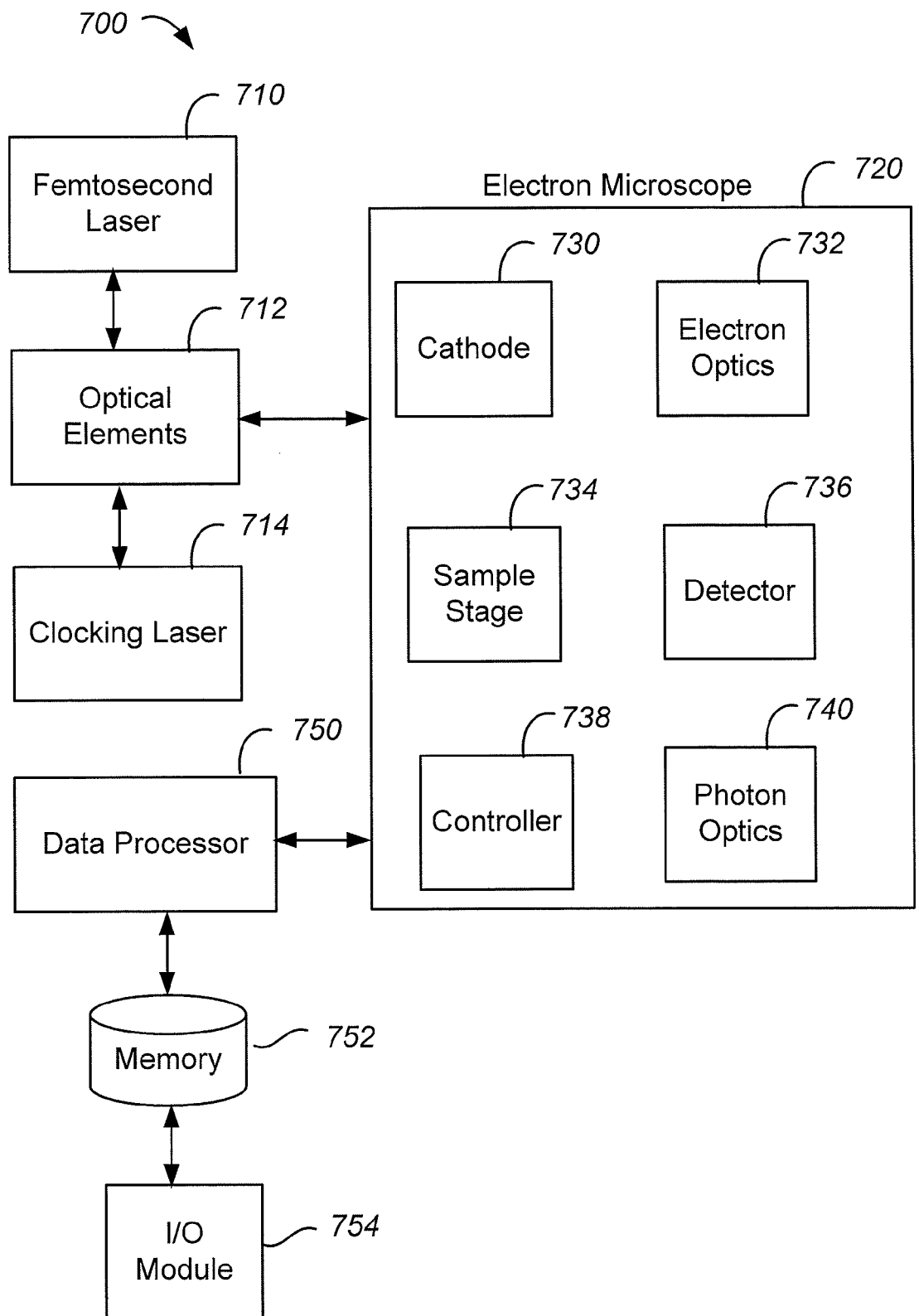
FIG. 7 is a simplified schematic diagram of a SUEM system according to an embodiment of the present invention.

FIG. 7 is a simplified schematic diagram of a SUEM system according to an embodiment of the present invention. The SUEM system 700 includes a femtosecond laser 710 and optical elements 712 that couple the laser pulses from the femtosecond laser into the electron microscope 720. The SUEM system 700 also includes a clocking laser 714 that is used to initiate dynamic changes in the specimens. The clocking laser 714 may be the same laser as the femtosecond laser 710 or a separate laser depending on the particular implementation. As illustrated in FIG. 6A, a single laser and optical elements (e.g., a beam splitter) can be used to provide separate laser beams. The optical elements 712 can include a variable length optical delay stage to introduce a time delay between the arrival time of the laser excitation pulse at the specimen relative to that of the electron probe pulse and thereby initiate dynamic changes (i.e., to adjust the axis of time on the ultrashort time scale).

The electron microscope 720 includes a cathode 730, also referred to as a field emission source and electron optics 732 that direct the electron pulse generated at the field emission source to the sample stage 734 on which the specimen is supported. The electron optics 732 can include the scanning optics that sweep the electron pulses over the surface of the specimen. One or more detectors 736 are provided to detect the secondary or backscattered electrons as appropriate to the particular application. In some embodiments, photon optics 740 are provided within the electron microscope 720 to direct the clocking pulse to impinge on the specimen. A controller 738 is utilized to control the various elements of the microscope and can be responsive to data processor 750, which can receive outputs from the detector, provide inputs to the sample stage and the controller, and the like. In the illustrated embodiment, a memory 752 is coupled to the data processor 750 and to an input/output (I/O) module 754 to enable a user to interact with the SUEM system. One of ordinary skill in the art would recognize many variations, modifications, and alternatives.

FIGS. 8A-D illustrates images of biological specimens obtained according to an embodiment of the present invention. The illustrated SUEM images were recorded using the secondary electrons from the specimens. The femtosecond pulses at 25.2 MHz were typically 2 nJ in energy and had a wavelength of 343 nm. The images were obtained either as a single frame with a dwell time of 200 microseconds (µs) at each pixel, or as integration of 64 frames with the dwell time being 3 µs. This integration suppresses image intensity fluctuations. Effectively, for each pixel, ~5,000 pulses were utilized in the SUEM mode, resulting in an acquisition time of ~50 s when an array of 512×442 pixels was scanned.

FIG. 8A illustrates an image of setae on an ant's body at a magnification of 1,000× from a laser-on scan as well as a laser-off scan of the same region. As shown by the lower image, negligible background intensity is present in the laser-off scan. FIG. 8B illustrates the setae at a magnification of 5,000× with an inset of an SUEM image of the ant at a magnification of 55×. FIG. 8C illustrates an image of a leukocyte (white blood cell) and FIG. 8D illustrates an image of an erythrocyte (red blood cell) at a magnification of 20,000×. As shown in FIGS. 8C and 8D, submicron features on the cell surfaces are clearly resolved.

Figure 8:
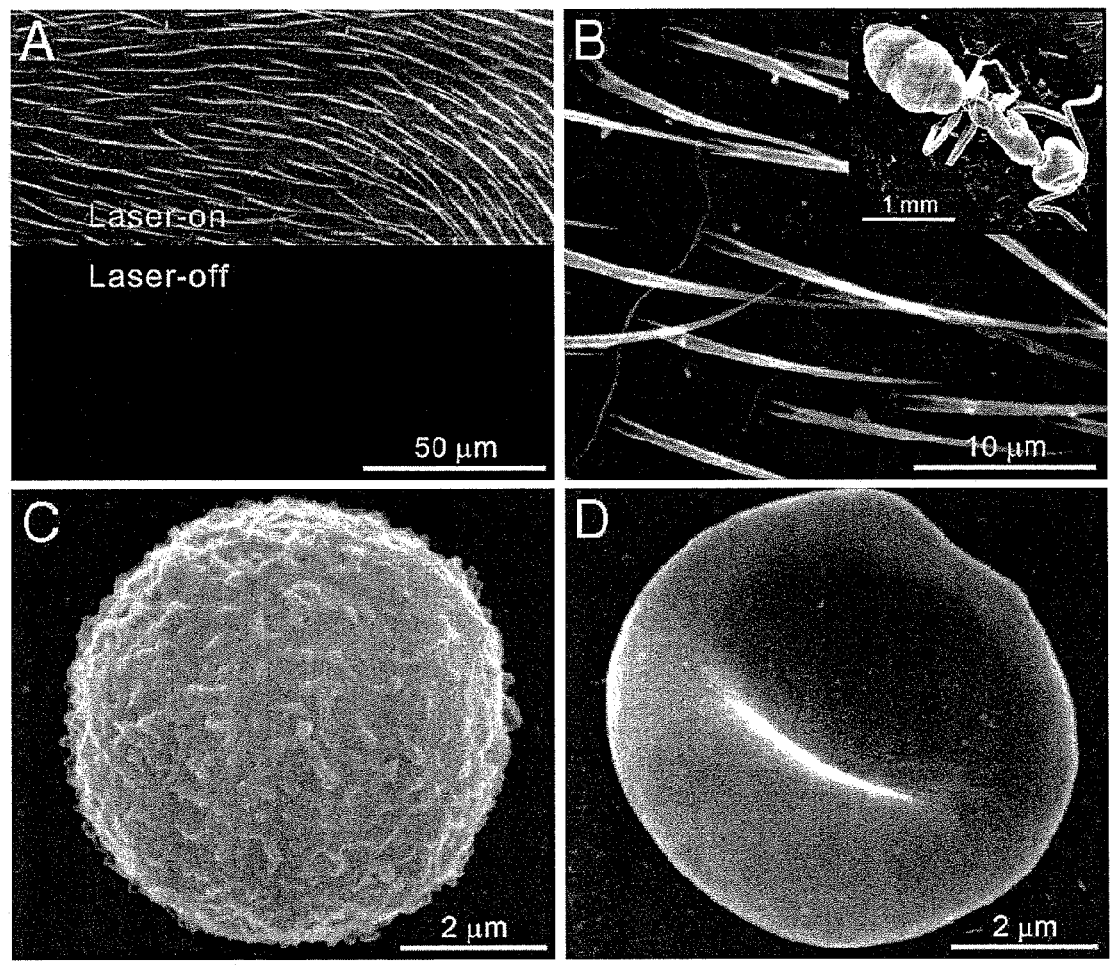
FIGS. 8A-D illustrate images of biological specimens obtained according to an embodiment of the present invention.
Figure 9:
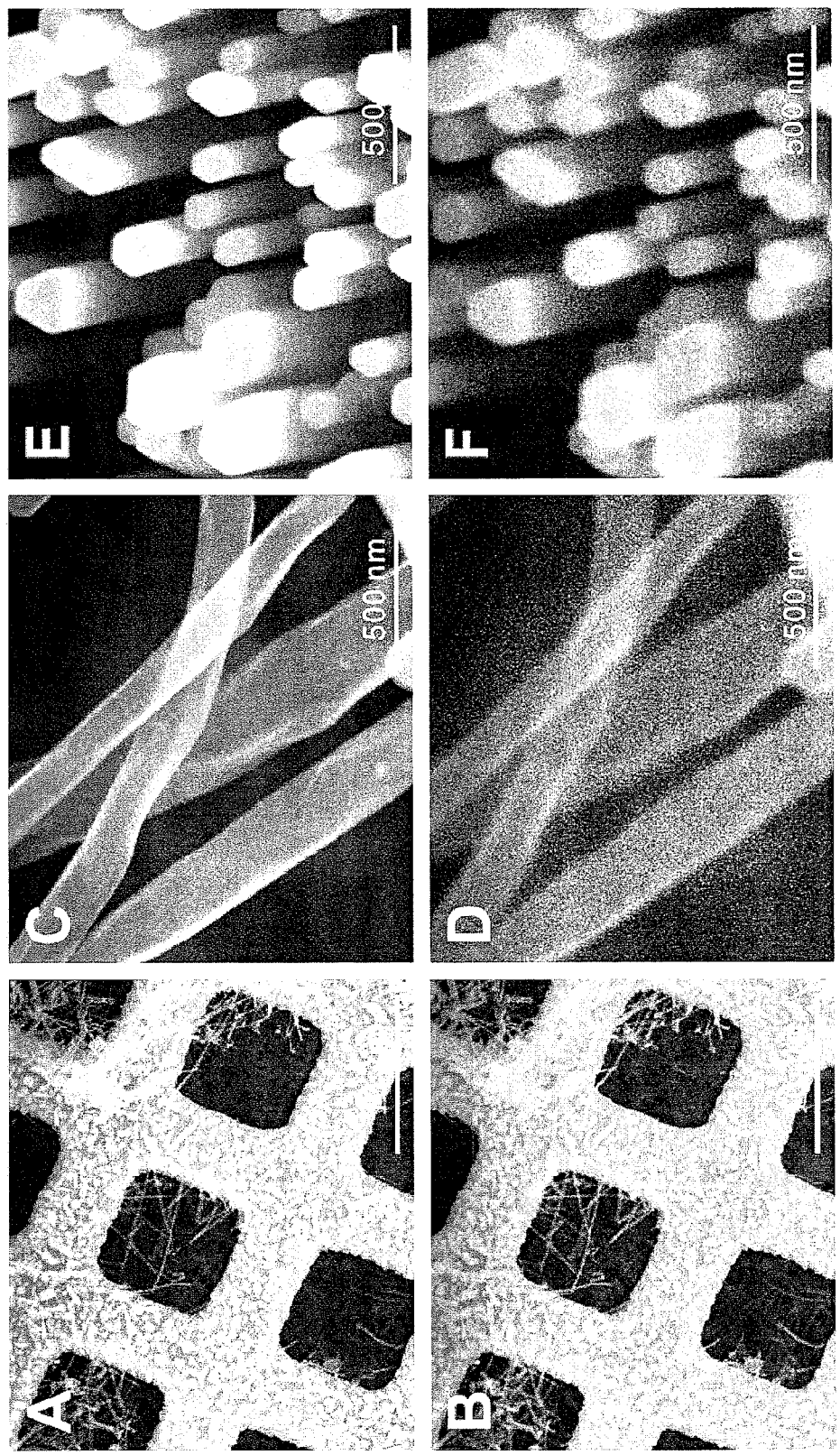
FIGS. 9A-F illustrate images of nanostructures obtained according to an embodiment of the present invention.

Referring to FIG. 8A, verification of the SUEM imaging was provided as follows. With the field emitter operated in the cold condition (at room temperature and not at 1800 K), the femtosecond laser pulses were blocked/unblocked to observe changes in the image. As demonstrated in the lower portion of FIG. 8A, only black contrast was observed when the electron-generating femtosecond pulses were blocked, which attests to the negligibility of both the thermionic and field tunneling emission from the unilluminated cold source. In addition, by changing the dwell time from a microsecond to as short as 50 ns, the response in intensity change (between laser-on and laser-off) remained instantaneous, indicating the absence of a "thermal tail" in the electron pulse train. Thus, these results demonstrate that the images illustrated in FIGS. 8 and 9 were acquired in the SUEM mode of operation. The good image quality illustrated in FIG. 8B reflects a steady probe current during the single-frame image acquisition with the pulsed electron source. Embodiments of the present invention provide for maintaining such stability; i.e., a precise and stable alignment of the optical beam that is tightly focused on the sharp emitter tip, for an extended period of time over which dynamical studies are made.

FIGS. 9A-F illustrate images of nanostructures obtained according to an embodiment of the present invention. The high magnification images illustrated in FIGS. 9A, 9C, and 9E are SEM images while FIGS. 9B, 9D, and 9F are SUEM images. Carbon nanotubes on a copper grid are imaged at a magnification of 5,000× in FIGS. 9A and 9B. Carbon nanotubes are imaged at a magnification of 100,000× in FIGS. 9C and 9D. Zinc oxide nanowires are imaged at a magnification of 100,000× in FIGS. 9E and 9F. The SUEM and SEM images (all acquired through the 64-frame integration method) show similar contrast, and the spatial resolution is near 10 nm.

It should be appreciated that, for these results, the average probe current in the SUEM mode was only $10^{-2}$~$10^{-5}$ of that used in the various typical settings of an SEM. Given the threshold relationship between the probe current and frame time, for a given contrast, higher resolution can be achieved by varying the acquisition time, repetition rate and image averaging of frames. It should be noted that high repetition rates in SUEM are possible because of the efficient heat dissipation. Thus, some embodiments of the present invention are only limited by the relaxation time under study.

Figure 10:
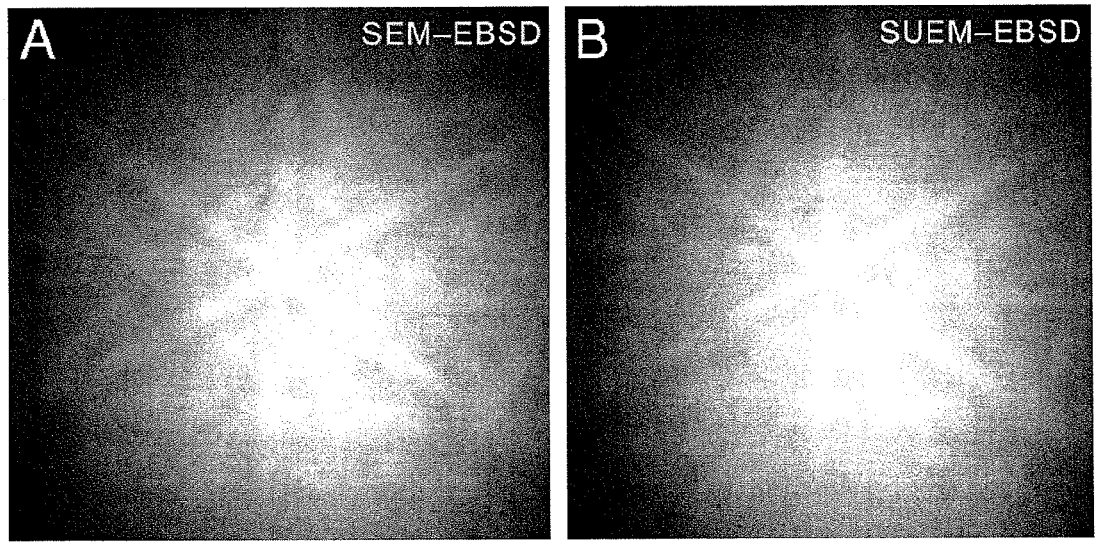
FIGS. 10A-B illustrate electron backscattering diffraction patterns according to an embodiment of the present invention.

FIGS. 10A-B illustrate electron backscattering diffraction patterns according to an embodiment of the present invention. The electron backscattering diffraction (EBSD) patterns of Si(001) are illustrated in FIG. 10A using SEM and in FIG. 10B using SUEM (with 2×2 binning) The zone axis at the center is [111]. The close resemblance between the two images taken with the pulsed and continuous electron sources is evident. A major difference is the acquisition time, which is typically on the order of 10-100 ms for the SEM mode and tens of seconds for the SUEM mode for the operating laser characteristics. The 3 orders-of-magnitude difference matches well the ratio of the probe currents reaching the specimen. Given the high repetition rate (12.6 MHz) possible in some embodiments, it is possible to extract information about time-dependent structural changes from Kikuchi patterns that are recorded using only several electrons per pulse, but in a similar acquisition time. Referring to FIG. 10B, the SUEM-EBSD patterns was recorded at a 70° tilt for a fixed point (no scanning involved). For this embodiment, 10 nJ, 343 nm fs pulses at 12.6 MHz were utilized for the photoelectron generation and the acquisition time was about 1 minute.

Figure 11:
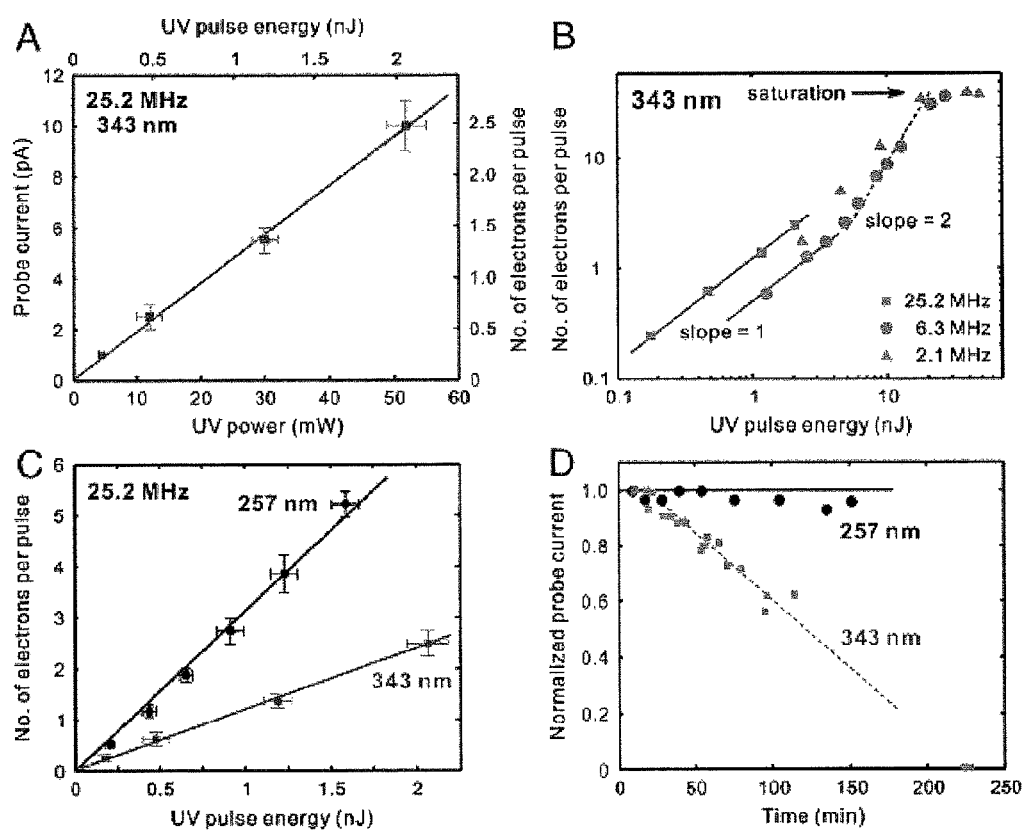
FIGS. 11A-D illustrate plots related to the mechanism of field photoemission according to an embodiment of the present invention.

FIGS. 11A-D illustrate plots related to the mechanism of field photoemission according to an embodiment of the present invention. FIG. 11A illustrates field-emitter dependence on pulse energy with a linear relationship between the number of electrons detected for the probe (np) and the 343 nm laser power used at the repetition rate of 25.2 MHz (i.e., in the low-power regime). FIG. 11B illustrates the dependence of np on the 343 nm pulse energy. A saturation behavior was noted at higher pulse energies. FIG. 11C illustrates a linear relation between np and the femtosecond pulse energy, for both 257 nm and 343 nm light. The efficiency of photoemission by 257 nm is ~3.5 times that by 343 nm. FIG. 11D illustrates photoemission efficiency from the cold emitter tip (by turning off the filament heating current) as a function of time lapse. A steady decay was seen in 2-3 hours for the case of the 343 nm light, whereas the decrease was negligible in 2.5 hours for the 257 nm case.

The results of SUEM imaging and diffraction show that the photoelectrons were generated from the emitter tip by the 343 nm (3.6 eV) or 257 nm (4.8 eV) light pulses. At the laser repetition rate of 25.2 MHz and with the highest spot-size setting of the SEM, an average probe current of ~10 pA generated by nJ, 343 nm pulses was measured, which corresponds to an average number of ~2.5 electrons per pulse reaching the specimen. In this low-power regime, a linear relation between the femtosecond pulse energy and the number of electrons at the probe was found as illustrated in FIG. 11A, indicating that the photoelectrons are generated by single-photon absorption of the 343 nm light. For a given femtosecond pulse energy, the highest probe current was observed when the polarization of the light was parallel to the tip axis and a significantly reduced value was seen when the polarization was to aligned with this axis. The minimum value was reached when the polarization was perpendicular to the tip axis. The polarization effect can be attributed to an increase in the probability of photon absorption (due to the preferred optical excitation of surface electrons) and/or the field enhancement ("lightning-rod") effect near the tip when the laser field is parallel to the tip axis. The latter effect is less important when the wavelength of excitation becomes larger or comparable to the length scale of the emitter's active area.

The photon energy used here is higher than the work function for the cold $ZrO_x/W(100)$ tip and therefore, single-photon absorption by electrons is enough to produce photoemission on the fs time scale. For a laser fluence of $F_{laser}$~1 mJ/cm$^2$, or a power density of $I_{laser}$~3×10$^9$ W/cm$^2$ at the tip, the electric field $E_{laser}$ imposed by this laser intensity [$|E_{laser}|$=27.45 µ√$I_{laser}$ in SI units] is ~10$^6$ V/cm. This value is an order of magnitude smaller than the field strength imposed by the DC voltage ($|E_{DC}|$10$^7$ V/cm), noting that such a field, $E_{DC}$ or $E_{laser}$, is prominent when the tip size is submicron.

The relation between the total field strength E at the cathode and the effective work function $\phi_{eff}$ is given by the following equation:

$$\phi_{eff} = \phi_w - e\sqrt{\frac{e|E|}{4\pi\varepsilon_0}} \equiv \phi_w - 3.8\times 10^{-4}(\text{eV})\sqrt{|E|},$$

where $\phi_w$ is the work function without field, e is the elementary positive charge, $\varepsilon_0$ is the vacuum permittivity, and $|E|$ is in the unit of V/cm. The second term represents the Schottky effect; i.e., the lowering of the barrier by the induced field. Based on the value of $E_{laser}$, relative to $E_{DC}$, and our observation of the linear behavior shown in FIG. 11A, the mechanism of optical field emission is believed to be less important in the present low-power regime. For $|E_{laser}|$~10$^6$ V/cm, $\phi_{eff}$ is further lowered by ~0.06 eV.

At higher pulse energies, a deviation was observed from the aforementioned linear relationship between the femtosecond light energy and the probe current as illustrated in FIG. 11B. A change in the value of the slope from one signifies the involvement of other mechanisms such as the simultaneous absorption of two or more photons in photoelectron generation and, possibly, an increased contribution from field emission. Saturation was reached when the 343 nm femtosecond pulse energy was ~25 nJ (at the lower repetition rates of 2.1 and 6.3 MHz), yielding ~40 electrons per pulse at the specimen. At this level, due to the relatively high number of photoemitted electrons (likely on the order of 10$^4$) at the source, the electron-electron repulsion at the emitter tip could contributes to spatial and temporal profile broadenings, which is consistent with our observation that resolution in the images decreases at the highest electron density used.

According to embodiments of the present invention, images can be obtained using the 257 nm pulses. For these pulses a higher efficiency (by a factor of ~3.5) in photoelectron generation was evident, compared to the 343 nm light as illustrated in FIG. 11C. The same mechanism of single-photon absorption is involved in the lower-power regime because of the linear relationship between the femtosecond pulse energy and the number of electrons detected at the specimen.

A similar saturation behavior was also noted when the pulse energy becomes above 15 nJ in value (measured at 6.3 MHz). However, there was a difference in the performance. The photoemission efficiency by the 257 nm light remained at a similar level for much longer times as illustrated in FIG. 11D. This is likely because photons with higher energy can assist electrons to overcome the elevated work function barrier even when the coverage of gas molecules occurs over time. Accordingly, the higher stability of the photoemitter performance with 257 nm femtosecond pulses is especially suitable for dynamics studies that utilize longer acquisition times.

SUEM, as described throughout the present specification, provides the ability to obtain measurements of structural dynamics, particularly in various types of bulk or thicker specimens that are inappropriate for a transmission geometry. The repetition rates used for different experiments is determined, in part, by the characteristic recovery time of the materials studied. The femtosecond laser system described herein provides flexibility for the time between pulses. However, in other implementations, this time could be reduced to the nanosecond domain because of the use of thick samples.

Figure 12:
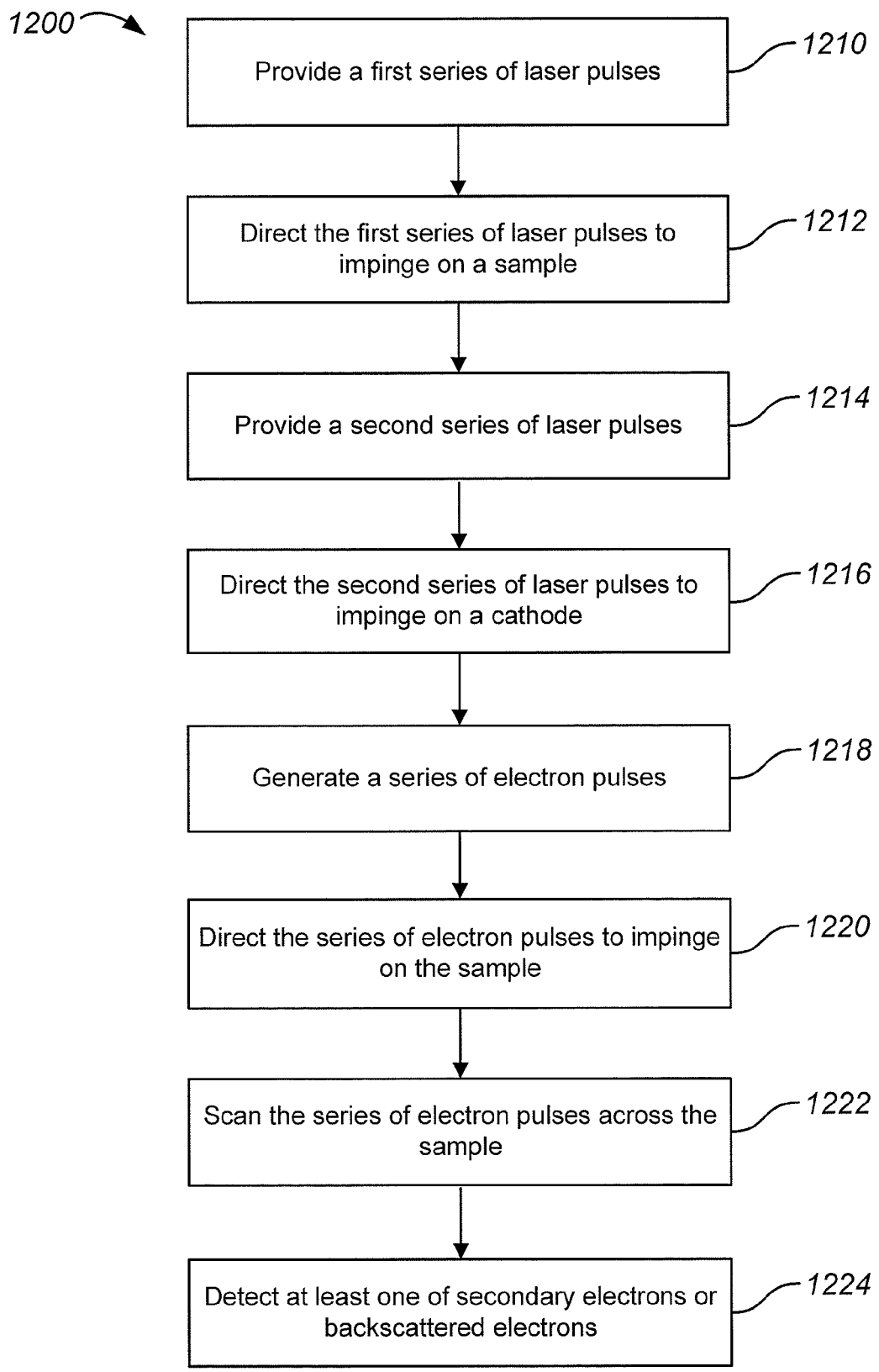
FIG. 12 is a simplified flowchart illustrating a method of obtaining an SUEM image according to an embodiment of the present invention.

FIG. 12 is a simplified flowchart illustrating a method of obtaining an SUEM image according to an embodiment of the present invention. The method 1200 includes providing a first series of laser pulses having a first duration and a first wavelength (1210) and providing a second series of laser pulses having a second duration and a second wavelength (1214). In an embodiment, a single laser source, a beam splitter, and one or more frequency conversion stages are used to provide a second wavelength that is less than the first wavelength, e.g., the second series of laser pulses is tripled or quadrupled and the first series of laser pulses is doubled. Although these frequency conversion processes are illustrated, other frequency conversion processes are included within the scope of the present invention. Depending on the temporal bandwidth of the frequency conversion processes, the first duration may be approximately equal to the second duration (e.g., less than 300 fs).

The method also includes directing the series of electron pulses to impinge on a sample (1212), directing the second series of laser pulses to impinge on a cathode (1216), and generating a series of electron pulses in response to the impingement of the second series of laser pulses on the cathode (1218). In one embodiment, the cathode includes a zirconium-oxide coated tungsten tip and the polarization of the second series of laser pulses is aligned with a longitudinal axis of the cathode tip. Using, for example, a half-wave plate the polarization can be aligned with the tip to maximize the pulsed current. In an embodiment, side illumination is used to generate electron pulses from the cathode. As an example, the electron pulses can be single electron pulses including a single or a few electrons.

The method further includes directing the series of electron pulses to impinge on the sample (1220), scanning the series of electron pulses across the sample (1222), and detecting at least one of secondary electrons or backscattered electrons (1224). In an embodiment, the series of electron pulses is delayed with respect to the first series of laser pulses, for example, by decreasing the optical delay in a delay stage through which the first series of laser pulses passes.

It should be appreciated that the specific steps illustrated in FIG. 12 provide a particular method of obtaining an SUEM image according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 4D electron tomography system comprising:
   a stage having one or more degrees of freedom;
   an electron source operable to provide electron pulses;
   electron optics operable to direct the electron pulses to impinge on a sample supported on the stage, wherein a pulse of the electron pulses impinges on the sample at a first time;
   a laser system operable to provide optical pulses;
   optics operable to direct the optical pulses to impinge on the sample, wherein a pulse of the optical pulses impinges on the sample at a second time;
   a detector operable to receive the electron pulses passing through the sample;
   a controller operable to independently modify an orientation of the stage and at least one of the first time or the second time;
   a memory operable to store sets of images associated with a predetermined delay time between the first time and the second time; and
   a processor operable to form a 4D tomographic image set from the sets of images.

2. The 4D electron tomography system of claim 1 wherein the one or more degrees of freedom comprises tilt about an axis.

3. The 4D electron tomography system of claim 2 wherein the axis is orthogonal to a normal to a surface of the detector.

4. The 4D electron tomography system of claim 1 further comprising an optical delay stage operable to delay at least one of the first time or the second time.

5. The 4D electron tomography system of claim 1 wherein the electron source provides electron pulses in response to an optical pulse.

6. The 4D electron tomography system of claim 1 wherein the detector comprises a two-dimensional array of detector elements.

7. The 4D electron tomography system of claim 1 wherein the sets of images associated with a predetermined delay time comprise images obtained at a series of tilt angles.

8. A method for performing 4D tomography of a sample, the method comprising:
   a) positioning a sample on a stage having one or more degrees of freedom, wherein the stage is characterized by a tilt angle;
   b) exposing the sample to a series of optical pulses;
   c) exposing the sample to a series of electron pulses;
   d) transmitting at least a portion of the series of electron pulses through the sample;
   e) detecting the at least a portion of the series of electron pulses using a two-dimensional detector;
   f) storing an image of the sample in a memory;
   g) tilting the stage to a new tilt angle;
   h) repeating steps b) through g) for a series of tilt angles;
   i) forming a three-dimensional image using the images stored in memory;

j) adjusting a time delay between pulses of the series of optical pulses and pulses of the series of electron pulses; and k) repeating steps b) through j) for a series of time delays.

9. The method of claim 8 wherein the one or more degrees of freedom comprises translation in a plane orthogonal to a direction of propagation of the electron pulses.

10. The method of claim 8 wherein the series of optical pulses provide initiating pulses to the sample.

11. The method of claim 8 wherein exposing the sample to a series of electron pulses comprises irradiating a cathode with a set of laser pulses.

12. The method of claim 8 wherein adjusting the time delay between pulses of the series of optical pulses and pulses of the series of electron pulses comprises use of an optical delay stage.

13. The method of claim 8 wherein adjusting the time delay between pulses of the series of optical pulses and pulses of the series of electron pulses comprises use of an electronic delay stage.

14. The method of claim 8 wherein the series of tilt angles spans over 100°.

15. A scanning ultrafast electron microscope system, the system comprising:
    a specimen chamber;
    an electron column;
    a cathode disposed in the electron column;
    a specimen stage disposed in the specimen chamber;
    a laser system operable to provide a beam of femtosecond pulses;
    a beam splitter coupled to the laser system and operable to provide a first optical beam and a second optical beam;
    an optical delay stage operable to receive the first optical beam;
    a first optical system operable to direct the first optical beam into the specimen chamber to impinge on the specimen;
    a second optical system operable to direct the second optical beam into the electron column to impinge on the cathode, wherein the cathode is operable to generate electron pulses in response to the second optical beam;
    electron optics disposed in the electron column and operable to direct the electron pulses to impinge on a specimen supported on the specimen stage and to scan the electron pulses with respect to the specimen;
    a detector operable to detect at least one of secondary electrons or backscattered electrons; and
    a controller coupled to the detector and the optical delay stage.

16. The system of claim 15 wherein the cathode comprises zirconium-oxide coated tungsten.

17. The system of claim 15 wherein a polarization of the second optical beam is aligned with a longitudinal axis of the cathode.

18. The system of claim 15 further comprising a frequency conversion stage coupled to the laser system, wherein a frequency of the first optical beam is less than or equal to a frequency of the second optical beam.

19. The system of claim 15 wherein each of the electron pulses includes less than ten electrons.

20. The system of claim 19 wherein each of the electron pulses includes about one electron.

21. A method of obtaining an image of a sample, the method comprising:
    providing a first series of laser pulses having a first duration and a first wavelength;
    directing the first series of laser pulses to impinge on a sample;
    providing a second series of laser pulses having a second duration and a second wavelength;
    directing the second series of laser pulses to impinge on a cathode;
    generating a series of electron pulses in response to the impingement of the second series of laser pulses on the cathode;
    directing the series of electron pulses to impinge on the sample;
    scanning the series of electron pulses across the sample; and
    detecting at least one of secondary electrons or backscattered electrons.

22. The method of claim 21 wherein the second wavelength is less than the first wavelength.

23. The method of claim 21 wherein the first duration is less than 300 fs.

24. The method of claim 21 wherein the second duration is less than 300 fs.

25. The method of claim 21 wherein the cathode comprises zirconium-oxide coated tungsten.

26. The method of claim 21 wherein a polarization of the second series of laser pulses is aligned with a longitudinal axis of the cathode.

27. The method of claim 21 further comprising delaying the series of electron pulses with respect to the first series of laser pulses.

28. The method of claim 21 wherein directing the second series of laser pulses to impinge on the cathode comprises side illumination of the cathode.

29. The method of claim 21 wherein the series of electron pulses comprise single electron pulses.

* * * * *